US008062702B2

(12) United States Patent
Barron et al.

(10) Patent No.: US 8,062,702 B2
(45) Date of Patent: Nov. 22, 2011

(54) COATED FULLERENES, COMPOSITES AND DIELECTRICS MADE THEREFROM

(75) Inventors: Andrew R. Barron, Houston, TX (US); Dennis J. Flood, Oberlin, OH (US); Elizabeth Whitsitt, Houston, TX (US)

(73) Assignees: William Marsh Rice University, Houston, TX (US); Natcore Technology Inc., Red Bank, NJ (US)

( * ) Notice: Subject to any disclaimer, the term of this patent is extended or adjusted under 35 U.S.C. 154(b) by 1344 days.

(21) Appl. No.: 10/496,066

(22) PCT Filed: Nov. 20, 2002

(86) PCT No.: PCT/US02/37211
§ 371 (c)(1),
(2), (4) Date: Nov. 17, 2004

(87) PCT Pub. No.: WO03/043934
PCT Pub. Date: May 30, 2003

(65) Prior Publication Data
US 2005/0089684 A1    Apr. 28, 2005

Related U.S. Application Data

(60) Provisional application No. 60/331,660, filed on Nov. 20, 2001.

(51) Int. Cl.
*B05D 7/00* (2006.01)
(52) U.S. Cl. .................................................. 427/213
(58) Field of Classification Search .............. 427/213
See application file for complete search history.

(56) References Cited

U.S. PATENT DOCUMENTS

| 4,845,056 | A | * | 7/1989 | Yamanis | 501/12 |
|---|---|---|---|---|---|
| 5,162,279 | A | | 11/1992 | Miki | |
| 5,274,018 | A | * | 12/1993 | Tanaka et al. | 524/166 |
| 5,308,661 | A | * | 5/1994 | Feng et al. | 427/535 |
| 5,397,350 | A | | 3/1995 | Chow et al. | |
| 5,416,188 | A | | 5/1995 | Chiang et al. | 528/291 |
| 5,420,081 | A | | 5/1995 | Mattes et al. | 501/12 |
| 5,424,054 | A | | 6/1995 | Bethune et al. | |

(Continued)

FOREIGN PATENT DOCUMENTS

DE         10036897 C3    1/2002

(Continued)

OTHER PUBLICATIONS

Seeger et al., SiOx-coating of carbon nanotubes at room temperature, May 4, 2001, Chem. Phys. Letters 339, pp. 41-46.*

(Continued)

*Primary Examiner* — Michael Cleveland
*Assistant Examiner* — Robert Vetere
(74) *Attorney, Agent, or Firm* — Winstead PC

(57) ABSTRACT

The present invention relates to coated fullerenes comprising a layer of at least one inorganic material covering at least a portion of at least one surface of a fullerene and methods for making. The present invention further relates to composites comprising the coated fullerenes of the present invention and further comprising polymers, ceramics and/or inorganic oxides. A coated fullerene interconnect device wherein at least two fullerenes are contacting each other to form a spontaneous interconnect is also disclosed as well as methods of making. In addition, dielectric films comprising the coated fullerenes of the present invention and methods of making are further disclosed.

43 Claims, 29 Drawing Sheets

SEM image, at 15,000x, of product of LPD silica reaction with fullerene added to reaction mixture.

U.S. PATENT DOCUMENTS

| | | | |
|---|---|---|---|
| 5,454,880 A | 10/1995 | Sariciftci et al. | |
| 5,648,128 A | 7/1997 | Yeh et al. | 427/601 |
| 5,690,807 A | 11/1997 | Clark, Jr. et al. | |
| 5,744,399 A | 4/1998 | Rostoker et al. | 438/622 |
| 5,747,161 A | 5/1998 | Iijima | |
| 5,908,585 A | 6/1999 | Shibuta | |
| 5,914,151 A * | 6/1999 | Usuki | 427/128 |
| 6,080,683 A | 6/2000 | Faur et al. | 438/770 |
| 6,106,609 A * | 8/2000 | Yang et al. | 117/11 |
| 6,126,740 A | 10/2000 | Schulz et al. | |
| 6,203,814 B1 | 3/2001 | Fisher et al. | |
| 6,207,229 B1 | 3/2001 | Bawendi et al. | |
| 6,277,766 B1 | 8/2001 | Ayers | |
| 6,333,598 B1 * | 12/2001 | Hsu et al. | 313/495 |
| 6,346,136 B1 | 2/2002 | Chen et al. | 75/343 |
| 6,348,295 B1 | 2/2002 | Griffith et al. | |
| 6,486,489 B2 | 11/2002 | Watanabe et al. | |
| 6,548,168 B1 | 4/2003 | Mulvaney et al. | |
| 6,559,375 B1 | 5/2003 | Meissner et al. | |
| 6,645,455 B2 | 11/2003 | Margrave et al. | |
| 6,657,696 B2 | 12/2003 | Aruga | |
| 6,683,783 B1 | 1/2004 | Smalley et al. | |
| 6,685,986 B2 | 2/2004 | Oldenburg et al. | |
| 6,710,366 B1 | 3/2004 | Lee et al. | |
| 6,723,624 B2 | 4/2004 | Wang et al. | |
| 6,740,910 B2 | 5/2004 | Roesner et al. | |
| 6,755,530 B1 | 6/2004 | Loftus et al. | |
| 6,770,497 B2 | 8/2004 | Ihm | |
| 6,827,918 B2 | 12/2004 | Margrave et al. | |
| 6,835,366 B1 | 12/2004 | Margrave et al. | |
| 6,841,139 B2 | 1/2005 | Margrave et al. | |
| 6,852,920 B2 | 2/2005 | Sager et al. | |
| 6,863,942 B2 | 3/2005 | Ren et al. | |
| 6,875,412 B2 | 4/2005 | Margrave et al. | |
| 6,894,359 B2 | 5/2005 | Bradley et al. | |
| 6,918,946 B2 | 7/2005 | Korgel et al. | |
| 6,946,597 B2 | 9/2005 | Sager et al. | |
| 6,969,897 B2 | 11/2005 | Kim, II | |
| 6,970,239 B2 | 11/2005 | Chan et al. | |
| 6,992,322 B2 | 1/2006 | Narayan | |
| 7,087,832 B2 | 8/2006 | Scher et al. | |
| 7,129,554 B2 | 10/2006 | Lieber et al. | |
| 7,253,014 B2 | 8/2007 | Barron et al. | |
| 7,253,431 B2 | 8/2007 | Afzali-Ardakani et al. | |
| 7,294,248 B2 | 11/2007 | Gao | |
| 7,321,097 B2 | 1/2008 | Engelhardt et al. | |
| 7,371,479 B2 | 5/2008 | Nuber | |
| 2001/0024078 A1 * | 9/2001 | Dimitrijevic et al. | 313/311 |
| 2002/0094699 A1 * | 7/2002 | Houng et al. | 438/779 |
| 2002/0110513 A1 | 8/2002 | Margrave et al. | |
| 2003/0065206 A1 | 4/2003 | Bolskar et al. | |
| 2003/0134433 A1 | 7/2003 | Gabriel et al. | |
| 2003/0234978 A1 | 12/2003 | Garito et al. | |
| 2004/0023317 A1 | 2/2004 | Motamedi et al. | |
| 2004/0265209 A1 | 12/2004 | Colbert et al. | |
| 2005/0119364 A1 | 6/2005 | Grah et al. | |
| 2006/0036045 A1 | 2/2006 | Wilson et al. | |
| 2006/0067870 A1 | 3/2006 | Park et al. | |
| 2006/0145194 A1 | 7/2006 | Barron et al. | |
| 2006/0186502 A1 | 8/2006 | Shimotani et al. | |
| 2006/0249203 A1 | 11/2006 | Li et al. | |
| 2007/0005116 A1 | 1/2007 | Lo | |
| 2008/0171204 A1 | 7/2008 | Barron et al. | |
| 2008/0233040 A1 | 9/2008 | Barron et al. | |

FOREIGN PATENT DOCUMENTS

| | | |
|---|---|---|
| EP | 1246205 A1 | 2/2002 |
| GB | 2370408 | 9/2001 |
| KR | 100649743 B1 | 11/2006 |
| WO | 9921934 A1 | 5/1999 |
| WO | 0051186 A1 | 8/2000 |
| WO | 0161753 A1 | 8/2001 |
| WO | 02051782 A1 | 7/2002 |
| WO | 02088024 A1 | 11/2002 |
| WO | 03043934 A1 | 5/2003 |
| WO | 2004042432 A2 | 5/2004 |
| WO | 2004042432 A3 | 5/2004 |
| WO | 2004044948 A2 | 5/2004 |
| WO | 2004044948 A3 | 5/2004 |
| WO | 2004046023 A2 | 6/2004 |
| WO | 2004046023 A3 | 6/2004 |
| WO | 2005000735 A2 | 1/2005 |
| WO | 2005000735 A3 | 1/2005 |
| WO | 2007041293 A2 | 4/2007 |
| WO | 2007041293 A3 | 4/2007 |
| WO | 2007084540 A2 | 7/2007 |
| WO | 2007084540 A3 | 7/2007 |

OTHER PUBLICATIONS

Hiura, JP 08-325195 (Machine Translation).*
Innocenzi et al., Optical Limiting Devices Based on C60 Derivatives in Sol-Gel Hybrid Organic-Inorganic Materials, J. Sol-Gel Sci. and Tech., 19, pp. 263-266, 2000.*
Satishkumar et al., "Oxide Nanotubes prepared using carbon nanotubes as templates," J. Mater. Res., vol. 12, pp. 604-606, 1997.*
Hiura, JP 08-325196 (machine translation), 1996.*
PCT International Search Report Dated Mar. 10, 2003 International Application # PCT/US0237211 6 p.
Fu, Qiang, et al., "*Selective Coating of Single Wall Carbon Nanotubes with Thin $SiO_2$ Layer*", American Chemical Society, Feb. 19, 2002, vol. 2, pp. 329-332.
Seeger, T., et al., "*Nanotube Composites: Novel $SiO_2$ Coated Carbon Nanotubes*", The Royal Society of Chemistry, Dec. 4, 2001, pp. 1-5.
Seeger, T., et al., "*$SiO_2$-Coating of Carbon Nanotubes at Room Temperature*", Elsevier Science, May 4, 2001, pp. 41-46.
O'Connell, Michael J., et al., "*Band Gap Fluorescence from Individual Single-Walled Carbon Nanotubes*", Science, Jul. 26, 2002, vol. 297, pp. 593-596.
Kong, Jing, et al., "*Nanotube Molecular Wires as Chemical Sensors*", Science, Jan. 28, 2000, vol. 287, pp. 622-625.
Collins, Philip G., "*Extreme Oxygen Sensitivity of Electronic Properties of Carbon Nanotubes*", Science, Mar. 10, 2000, vol. 287, pp. 1801-1804.
Kong, Jing, et al., "*Functionalized Carbon Nanotubes for Molecular Hydrogen Sensors*", Advanced Materials, 2001, vol. 13, No. 18, pp. 1384-1386.
Thess, Andreas, et al., "*Crystalline Ropes of Metallic Carbon Nanotubes*", Science, Jul. 26, 1996, vol. 273, Issue 5274, pp. 483-487.
Girifalco, L.A., et al., "*Carbon Nanotubes, Buckyballs, Ropes, and a Universal Graphitic Potential*", The American Physical Society, Nov. 15, 2000, vol. 62, No. 19, pp. 13 104-13 110.
Tsang, Shik Chi, et al., "*Immobilization of Platinated and Iodinated Oligonucleotides on Carbon Nanotubes*", Agnew. Chem. Int. Ed. Engl., 1997, vol. 36, No. 20, pp. 2198-2200.
Balavoine, Fabrice, et al., "*Helical Crystallization of Proteins on Carbon Nanotubes: A First Step Towards the Development of New Biosensors*", Agnew. Chem. Int. Ed. Engl., 1999, vol. 38, No. 13/14, pp. 1912-1915.
Chen, Robert J., et al., "*Noncovalent Sidewall Functionalization of Single-Walled Carbon Nanotubes for Protein Immobilization*", American Chemical Society, Jan. 22, 2001, pp. 3838-3839.
O'Connell, Michael J., et al., "*Reversible Water-Solubilization of Single-Walled Carbon Nanotubes by Polymer Wrapping*", Elsevier Science, Jul. 13, 2001, pp. 265-271.
Bronikowski, Michael J., et al., "*Gas-Phase Production of Carbon Single-Walled Nanotubes from Carbon Monoxide Via the HiPco Process: A Parametric Study*", American Vacuum Society, Jul./Aug. 2001, pp. 1801-1805.
Da Ros, Tatiana, et al., "*Fullerene Derivatives as Potential DNA Photoprobes*", CSIRO, 2001, vol. 54, pp. 223-224.
Kuzumaki, Toru, et al., "*Mechanical Characteristics and Preparation of Carbon Nanotube Fiber-Reinforced Ti Composite*", Advanced Engineering Materials, 2000, vol. 2, No. 7, pp. 416-418.
Foreign communication from a related counterpart application, International Search Report, PCT/US03/37188, Dec. 21, 2004, 3 pgs.
Foreign communication from a related counterpart application, International Search Report, PCT/US03/37186, Mar. 1, 2005, 2 pages.

Foreign communication from a related counterpart application, International Preliminary Examination Report, PCT/US03/37188, Sep. 30, 2005, 4 pgs.

Foreign communication from a related counterpart application, International Preliminary Examination Report, PCT/US02/37211, Dec. 4, 2003, 31 pgs.

Foreign communication from a related counterpart application, Written Opinion, PCT/US02/37211, Sep. 30, 2003, 5 pgs.

Foreign communication from a related counterpart application—International Search Report and Written Opinion, PCT/US2008/063404, Sep. 12, 2008, 15 pages.

Foreign communication from a related counterpart application—International Search Report and Written Opinion, PCT/US2008/063076, Sep. 16, 2008, 13 pages.

Office Action (Final) dated Nov. 4, 2008 (6 pages), U.S. Appl. No. 10/534,431, filed Jan. 24, 2006.

Office Action dated May 6, 2008, (7 pages), U.S. Appl. No. 10/534,431, filed Jan. 24, 2006.

Whitsitt, Elizabeth A., et al., "Silica coated single walled carbon nanotubes," Nano Letters, 2003, pp. 775-778, vol. 3, No. 6, American Chemical Society.

Banjerjee, Sarbajit, et al., "Synthesis and characterization of carbon nanotube-nanocrystal heterostructures," Nano Letters, 2002, pp. 195-200, vol. 2, No. 3, American Chemical Society.

Foreign communication from a related counterpart application—Supplementary European Search Report of Application No. EP 02 78 9769, Jan. 7, 2009, 8 pages.

Haremza, Joanne M., et al., "Attachment of single CdSe nanocrystals to individual single-walled carbon nanotubes," Nano Letters, 2002, pp. 1253-1258, vol. 2, No. 11, American Chemical Society.

Hernadi, K., et al., "Synthesis of MWNT-based composite materials with inorganic coating," Acta Materialia, 2003, pp. 1447-1452, vol. 51, Acta Materialia Inc., published by Elsevier Science Ltd.

Office Action dated Feb. 6, 2009 (25 pages), U.S. Appl. No. 11/834,471, filed Aug. 6, 2007.

Office Action dated Apr. 24, 2009 (10 pages), U.S. Appl. No. 10/534,431, filed Jan. 24, 2006.

Satishkumar, B. C., et al., "Oxide nanotubes prepared using carbon nanotubes as templates," Journal of Materials Research, Mar. 1997, pp. 604-606, vol. 12, No. 3, Materials Research Society.

Foreign communication from a related counterpart application—Supplementary European Search Report of Application No. EP 03 78 6924, Mar. 26, 2009, 3 pages.

Foreign communication from a related counterpart application—Supplementary European Search Report of Application No. EP 03 81 6414, Mar. 27, 2009, 3 pages.

Kreupl, Franz, et al., "A status report on technology for carbon nanotube devices," Solid State Technology, Apr. 1, 2002, pp. S09/S10, S12, S14, S16, vol. 45, Issue 4, Penwell Corporation, Tulsa, OK.

Foreign communication from a related counterpart application—Examination Report for European Patent Application No. 02789769. 3, Sep. 21, 2009, 6 pages.

Notice of Allowance and Fee(s) Due dated Nov. 2, 2009 (15 pages), U.S. Appl. No. 11/834,471, filed Aug. 6, 2007.

Notice of Allowance and Fee(s) Due dated Nov. 23, 2009 (11 pages), U.S. Appl. No. 10/534,431, filed Jan. 24, 2006.

O'Connell, Michael J., "Carbon Nanotubes Properties and Applications," 2006, pp. 90-104, CRC Press.

* cited by examiner

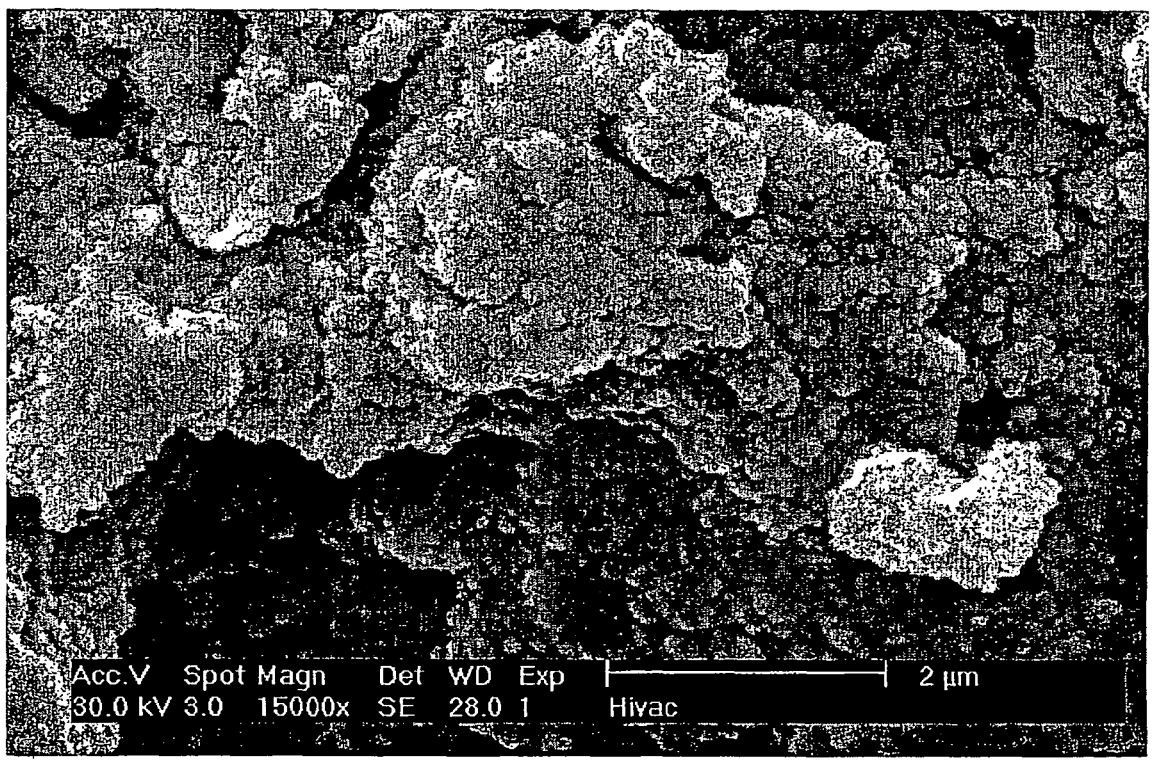
Figure 1: SEM image, at 15,000x, of silica product without particles added.

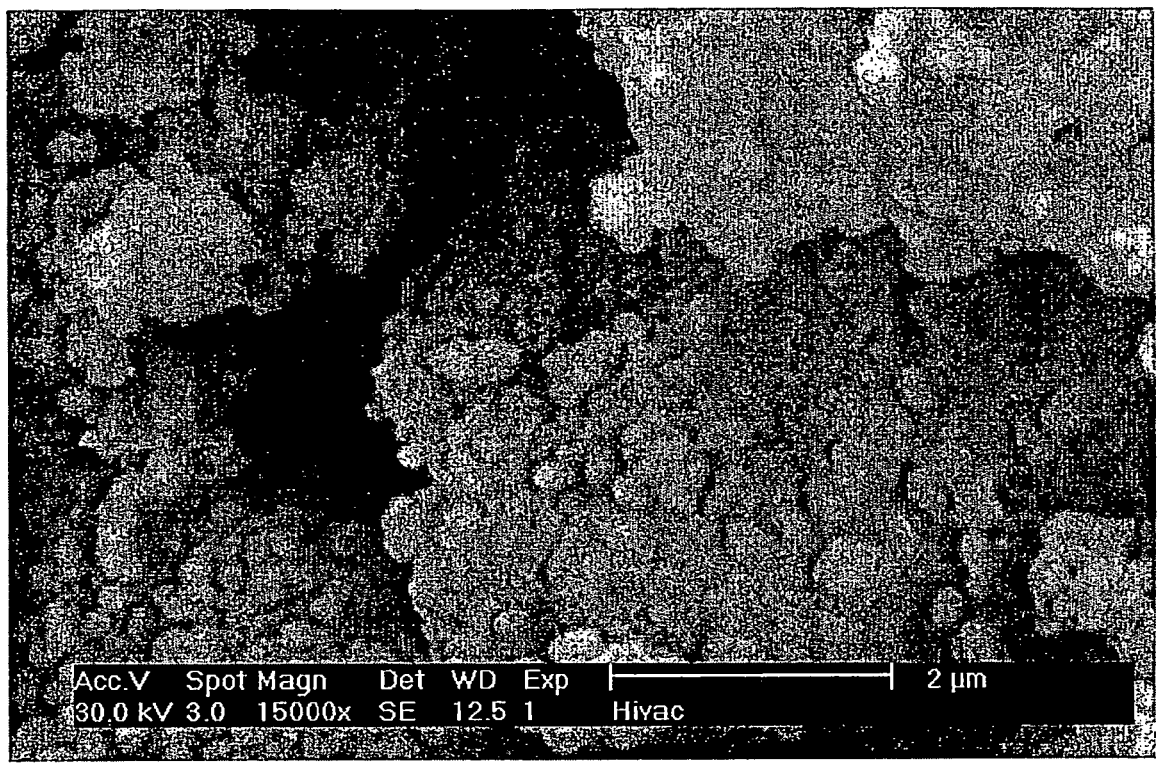
Figure 2: SEM image, at 15,000x, of product of LPD silica reaction with fullerene added to reaction mixture.

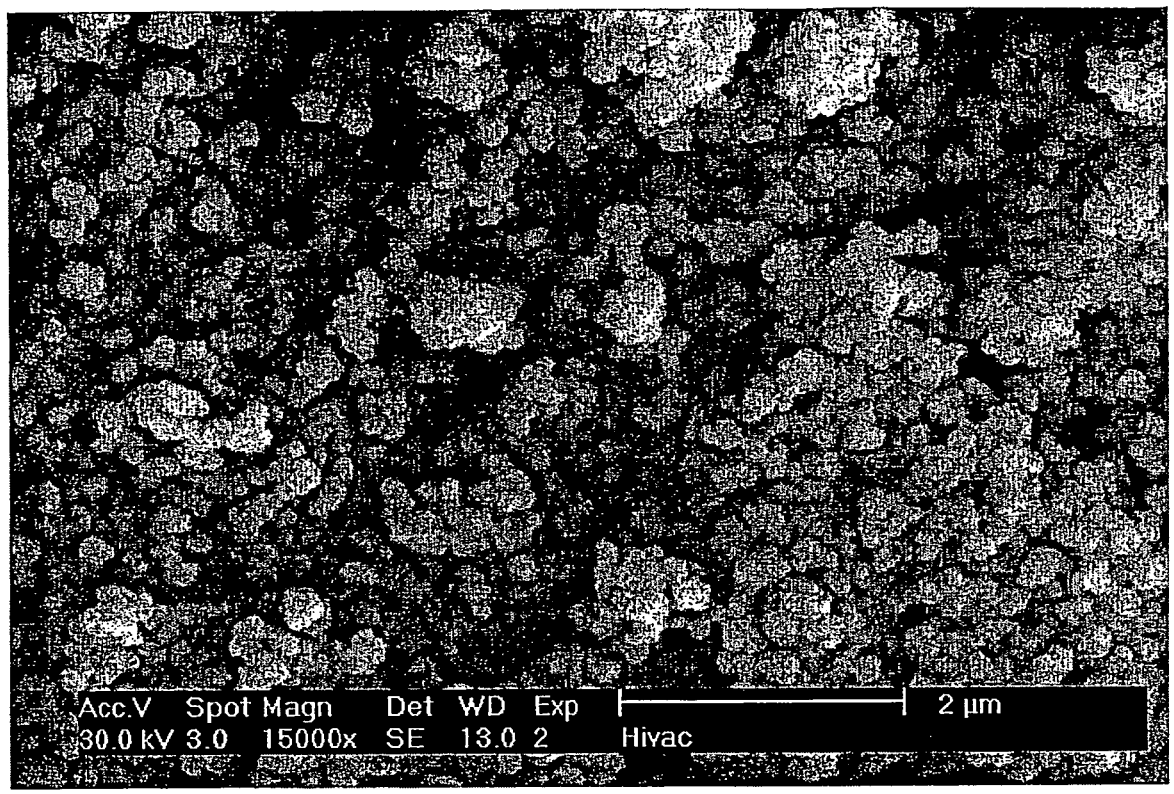
Figure 3: SEM image, at 15,000x, of product of LPD silica reaction with fullerenol added to reaction mixture.

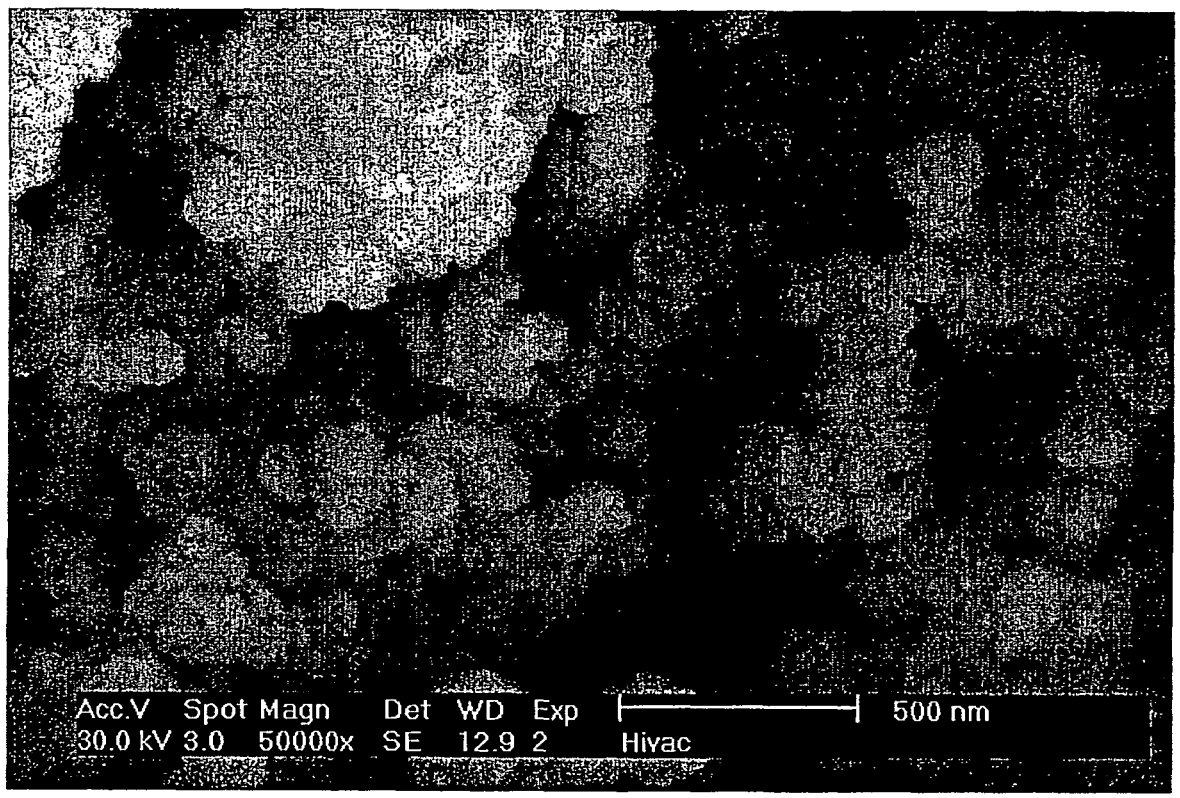
Figure 4: SEM image, at 50,000x, of product of LPD silica reaction with fullerenol added to reaction mixture.

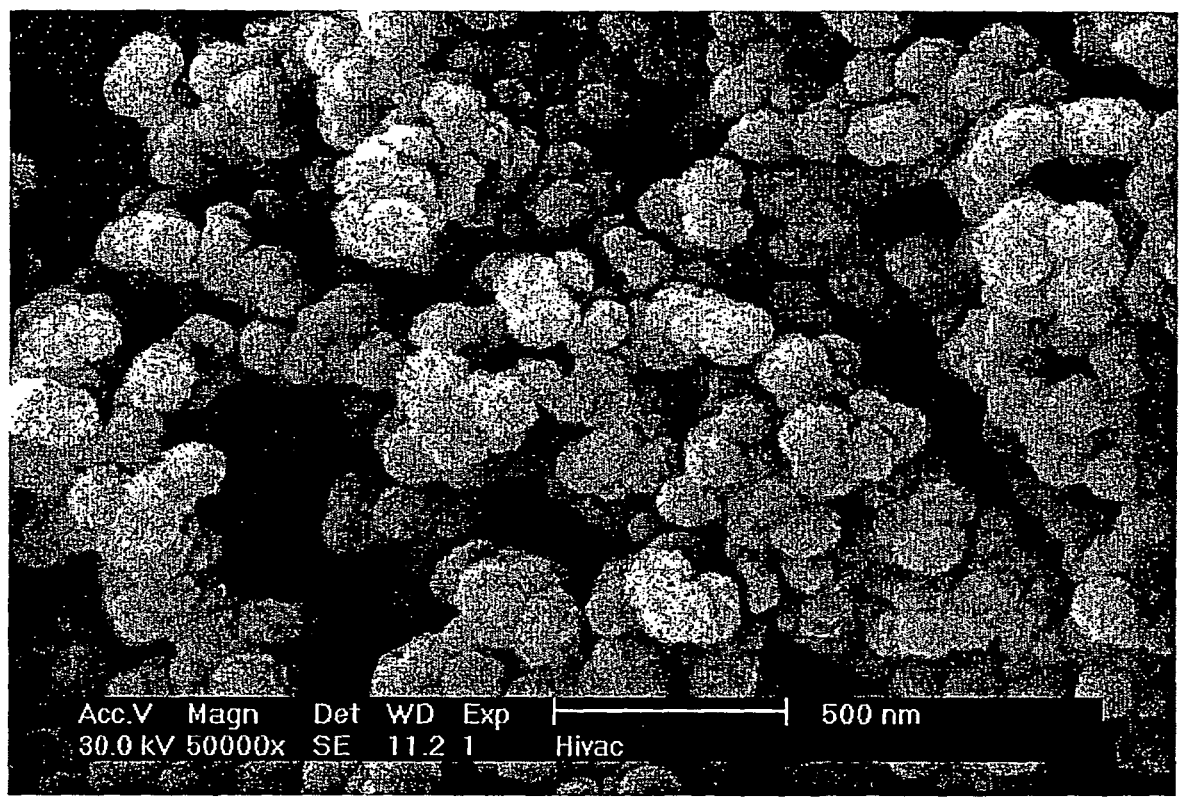
Figure 5: SEM image, at 50,000x, of product of LPD silica reaction with fullerenol added to reaction mixture.

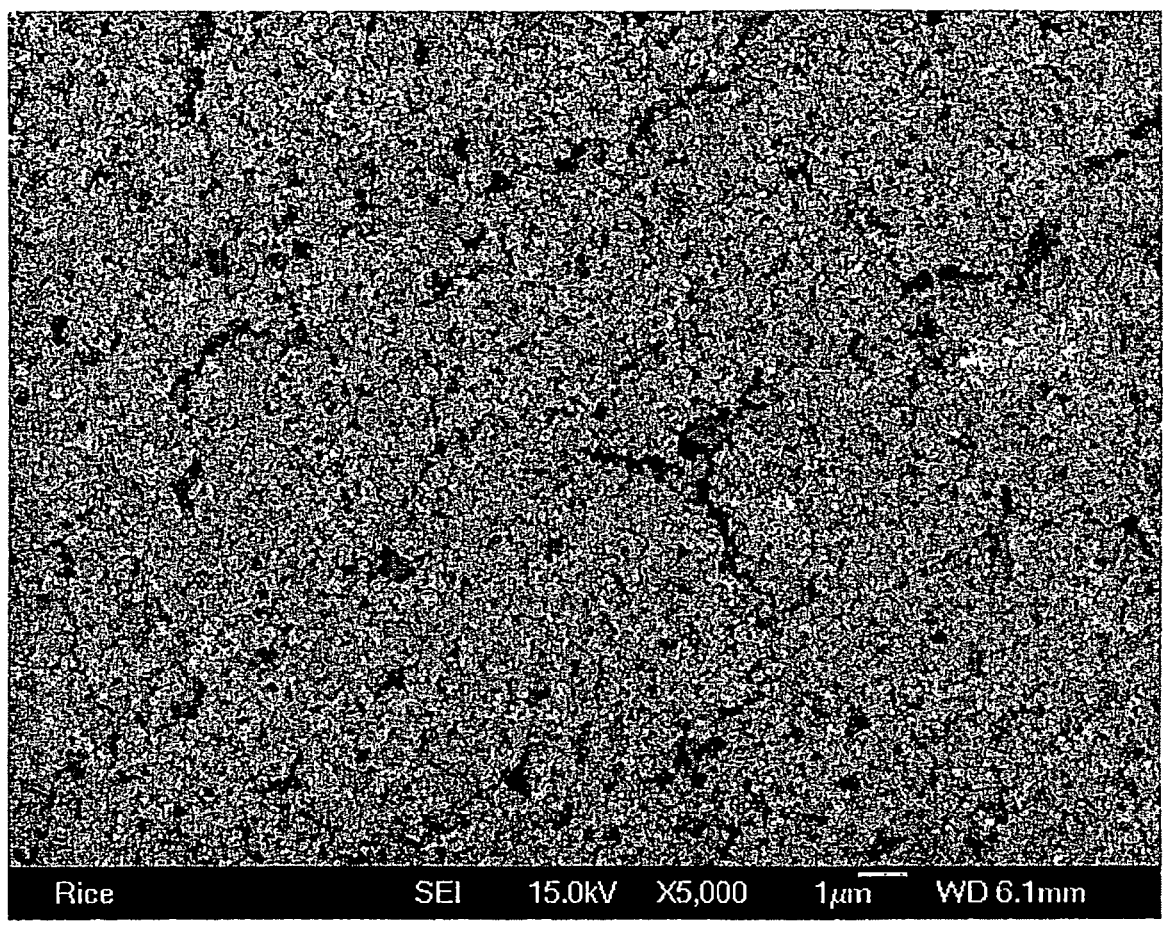
Figure 6: SEM image, at 5,000x, of product of LPD silica reaction with fullerenol added to reaction mixture.

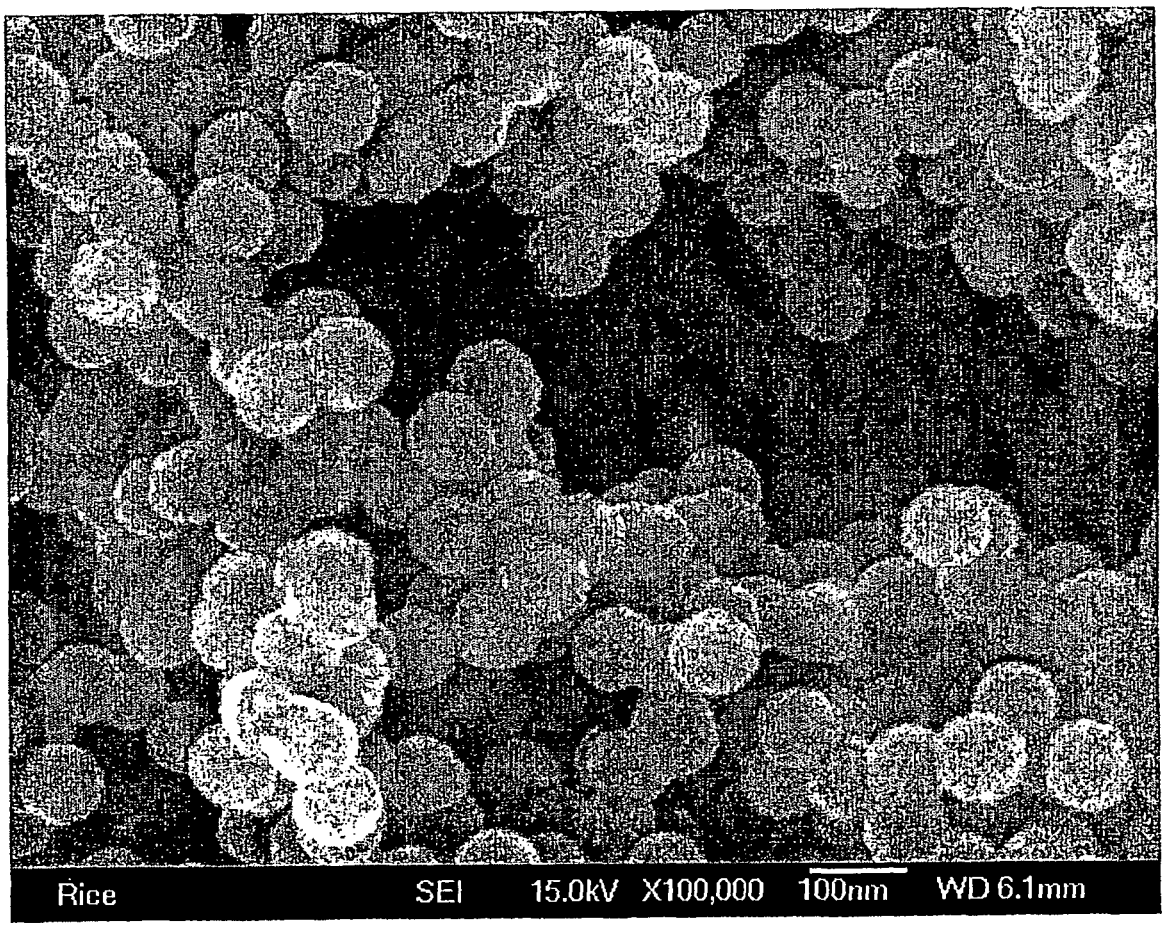
Figure 7: SEM image, at 100,000x, of product of LPD silica reaction with fullerenol added to reaction mixture.

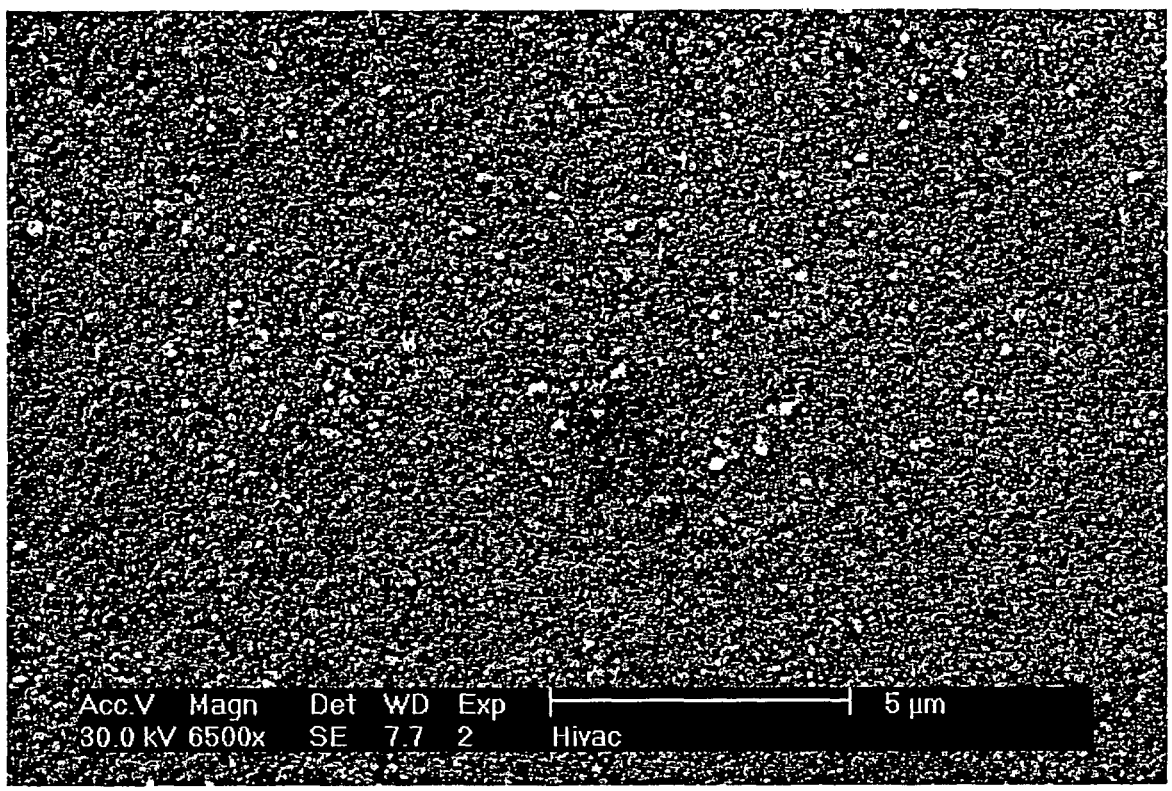
Figure 8: SEM image, at 6500x, of a silicon chip coated with silica-coated fullerenols.

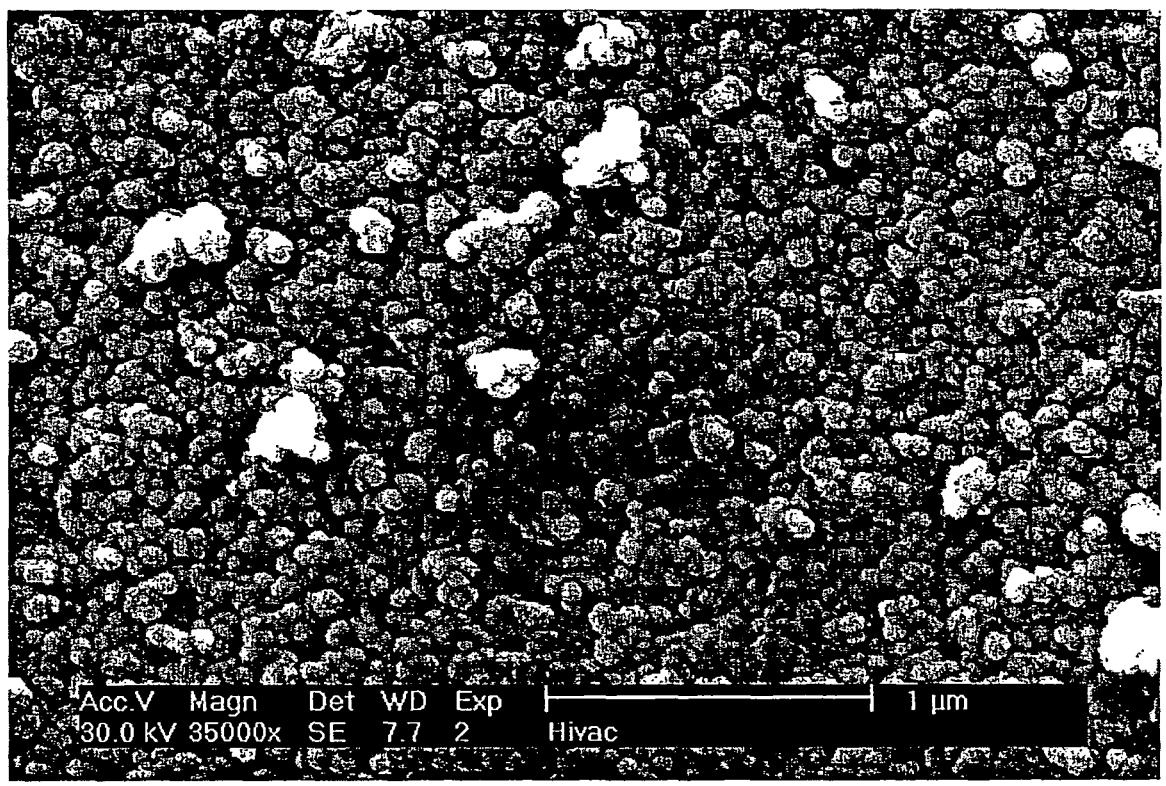
Figure 9: SEM image, at 35,000x, of a silicon chip coated with silica-coated fullerenols.

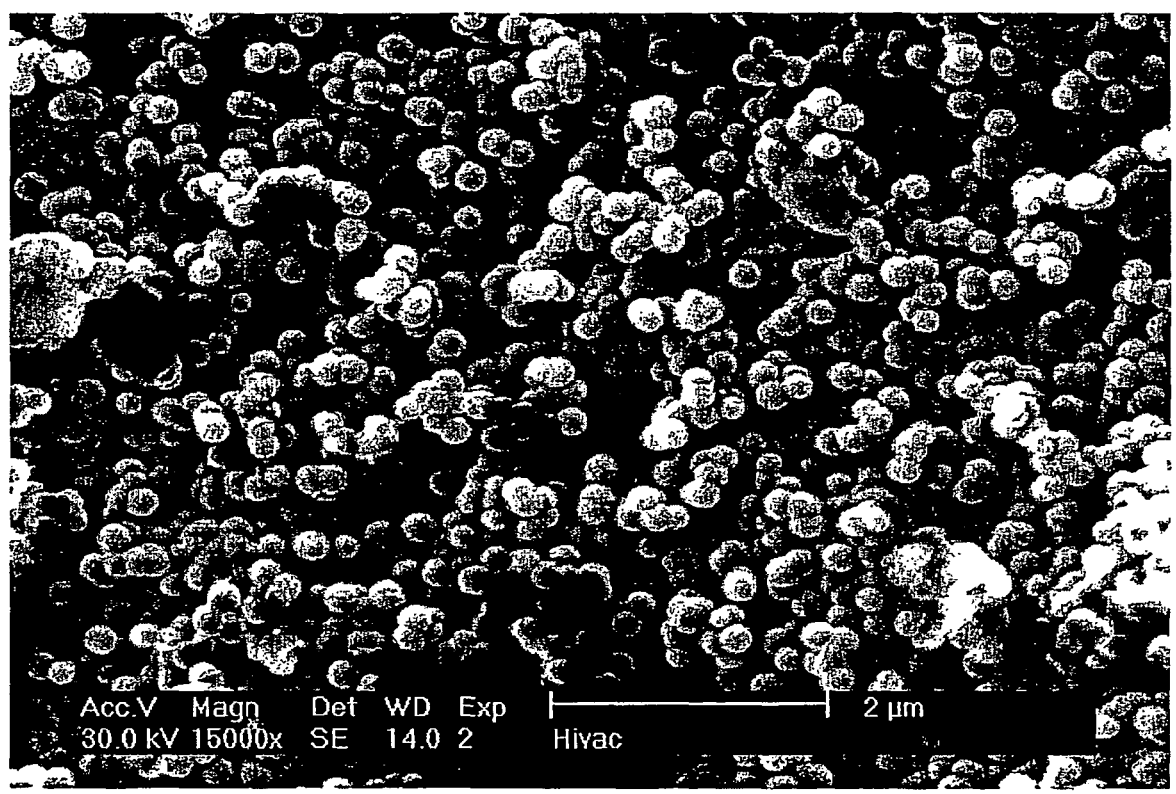
Figure 10: SEM image, at 15,000x, of twice-coated silicon chip.

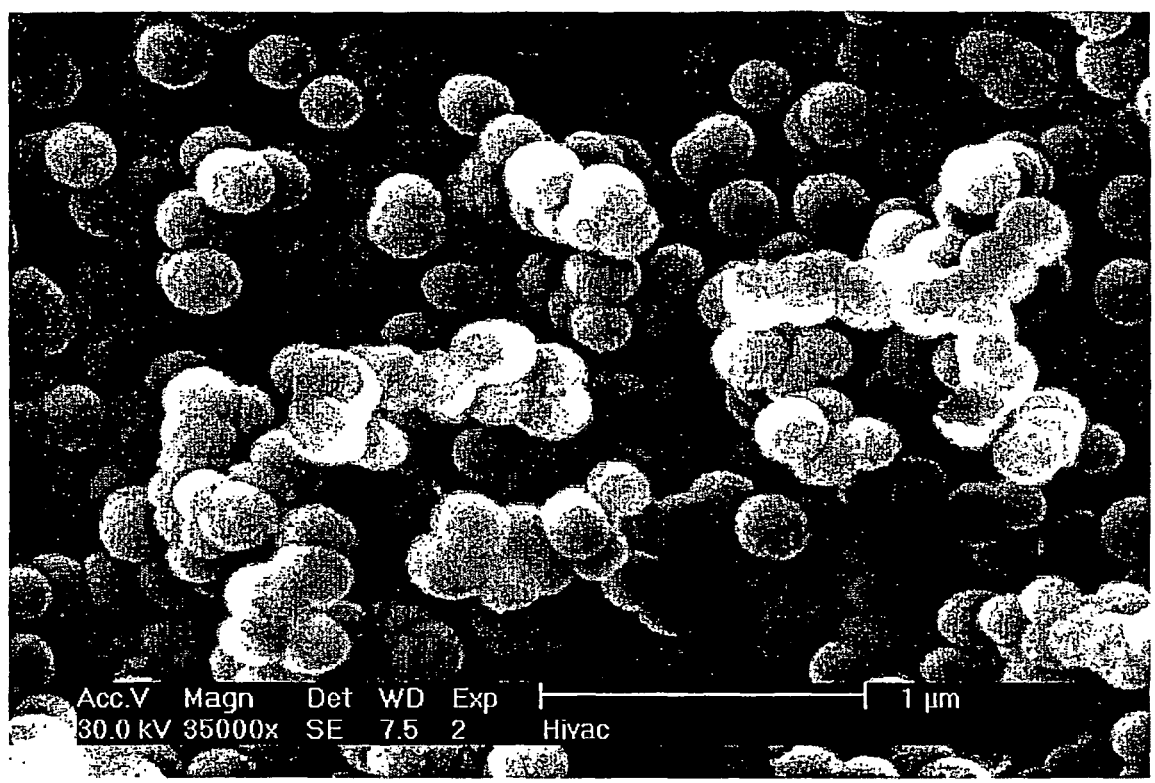
Figure 11: SEM image, at 35,000x, of twice-coated silicon chip.

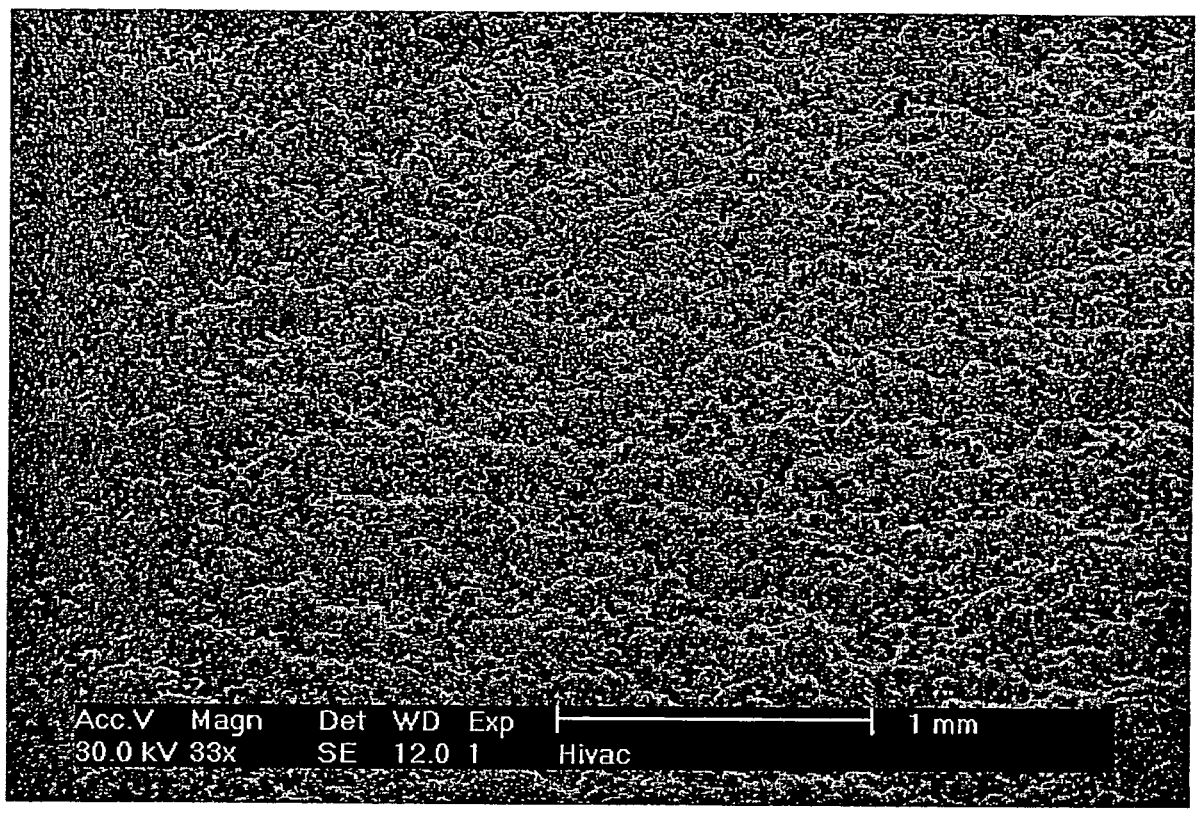
Figure 12: SEM image, at 50x, of glass slide coated with silica coated fullerenols.

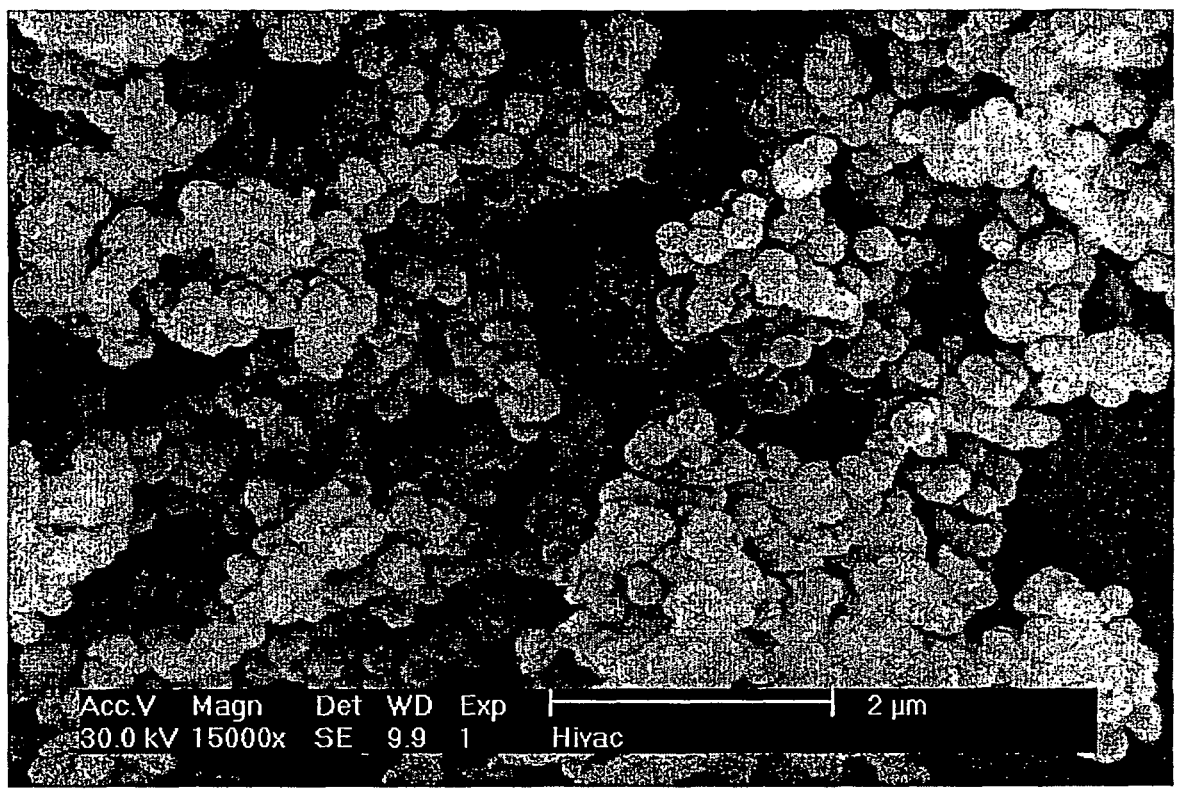
Figure 13: SEM image, at 15,000x, of the product of the reaction of SDS with the LPD silica solution.

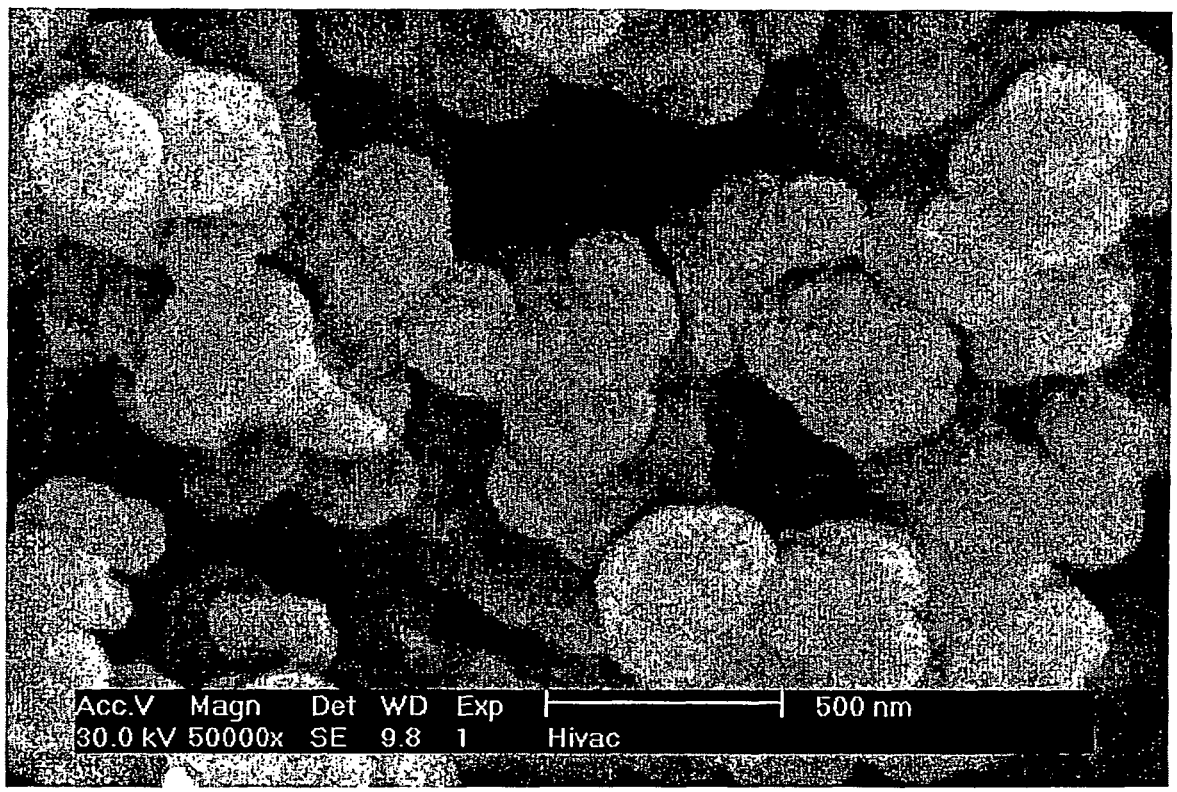
Figure 14: SEM image, at 50,000x, of the product of the reaction of SDS with the LPD silica solution.

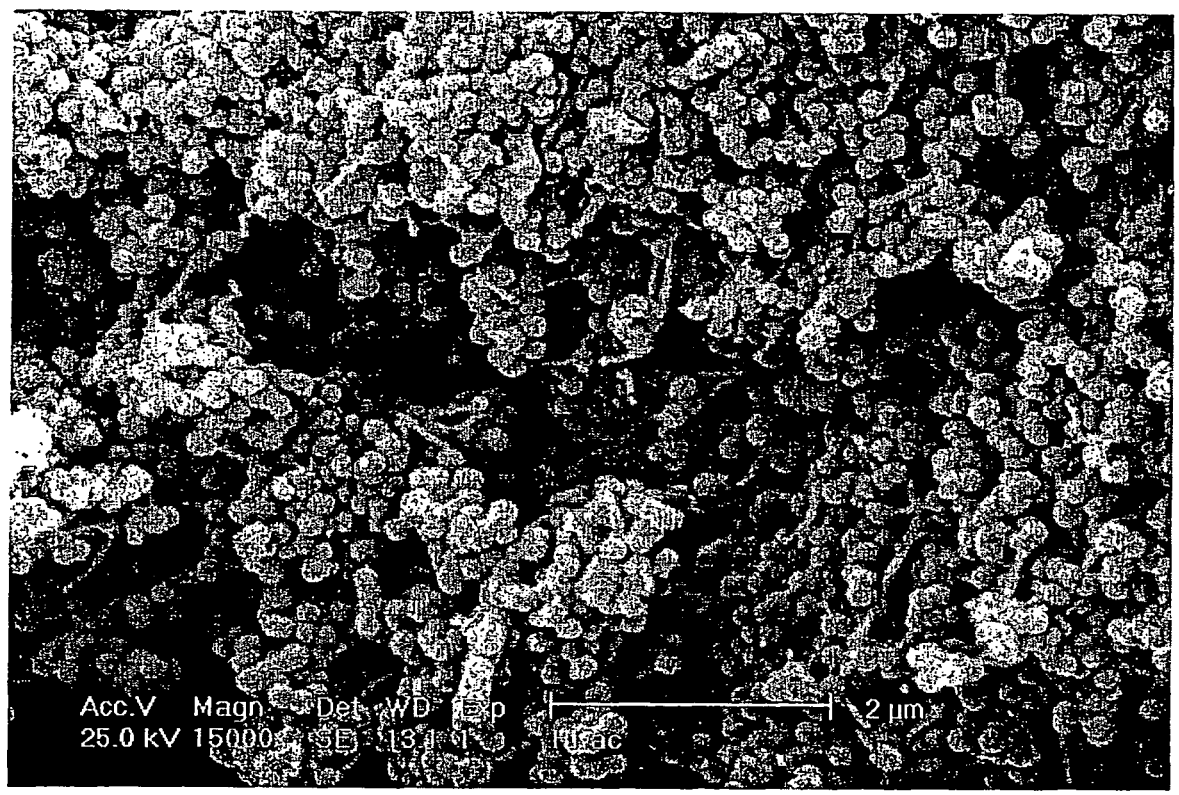
Figure 15: SEM image, at 15,000x, of the product of the reaction of SDS dispersed SWNTs with the LPD silica solution.

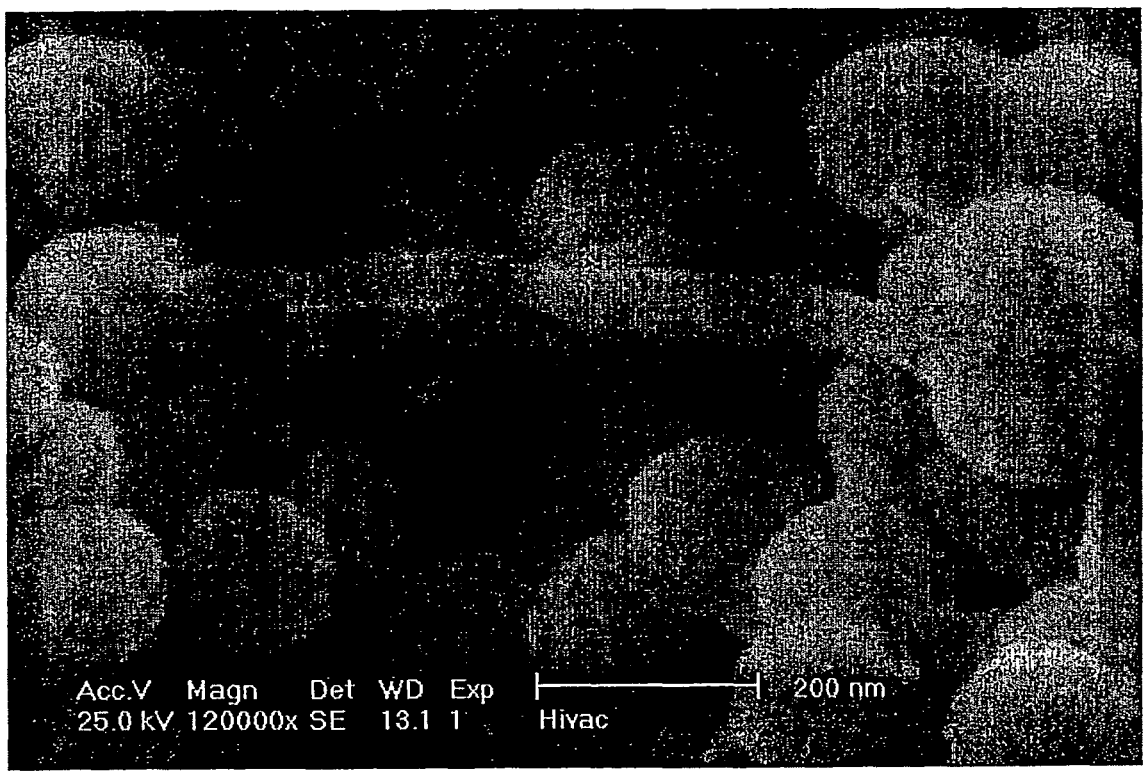
Figure 16: SEM image, at 120,000x, of the product of the reaction of SDS dispersed SWNTs with the LPD silica solution.

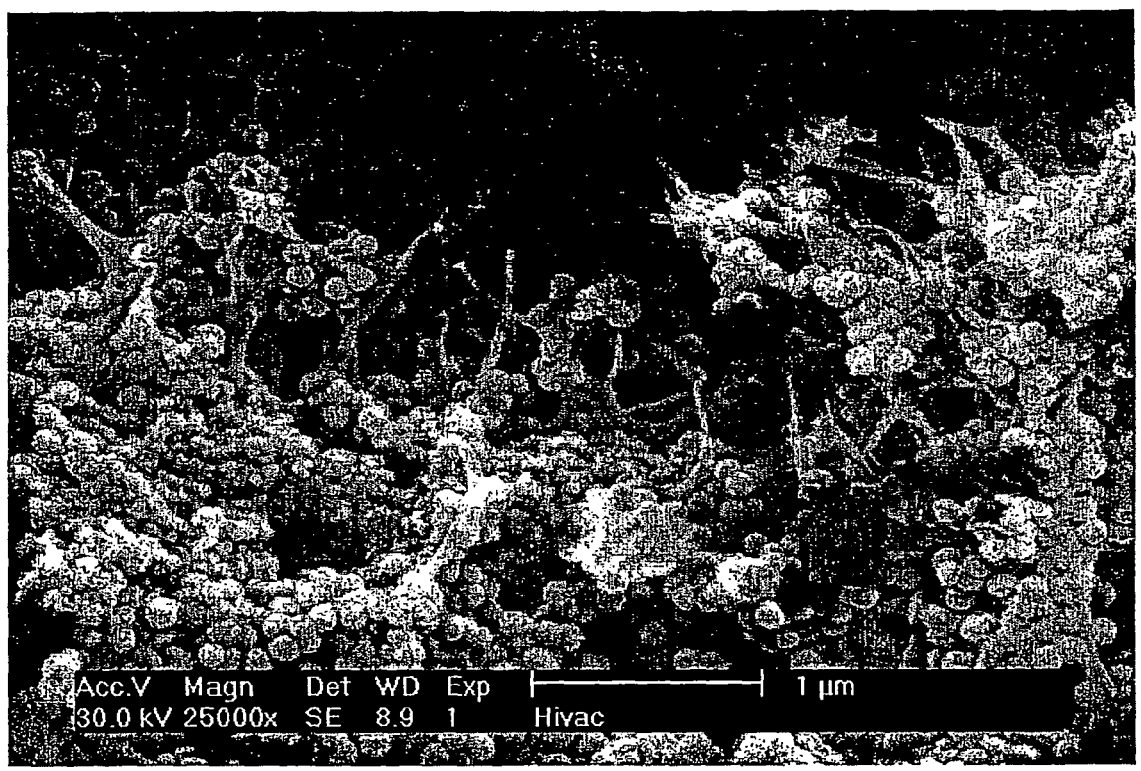
Figure 17: SEM image, at 25,000x, of the product of the reaction of SDS dispersed SWNTs with the LPD silica solution.

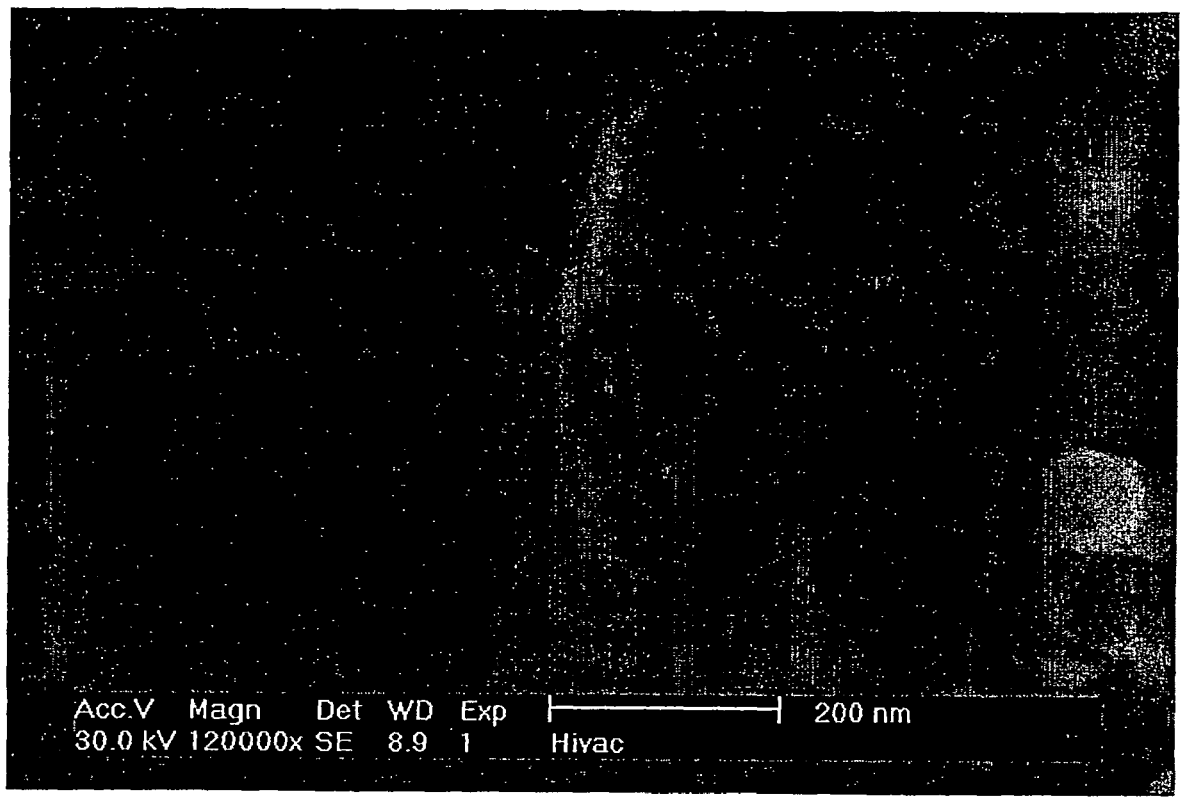
Figure 18: SEM image, at 120,000x, of the product of the reaction of SDS dispersed SWNTs with the LPD silica solution.

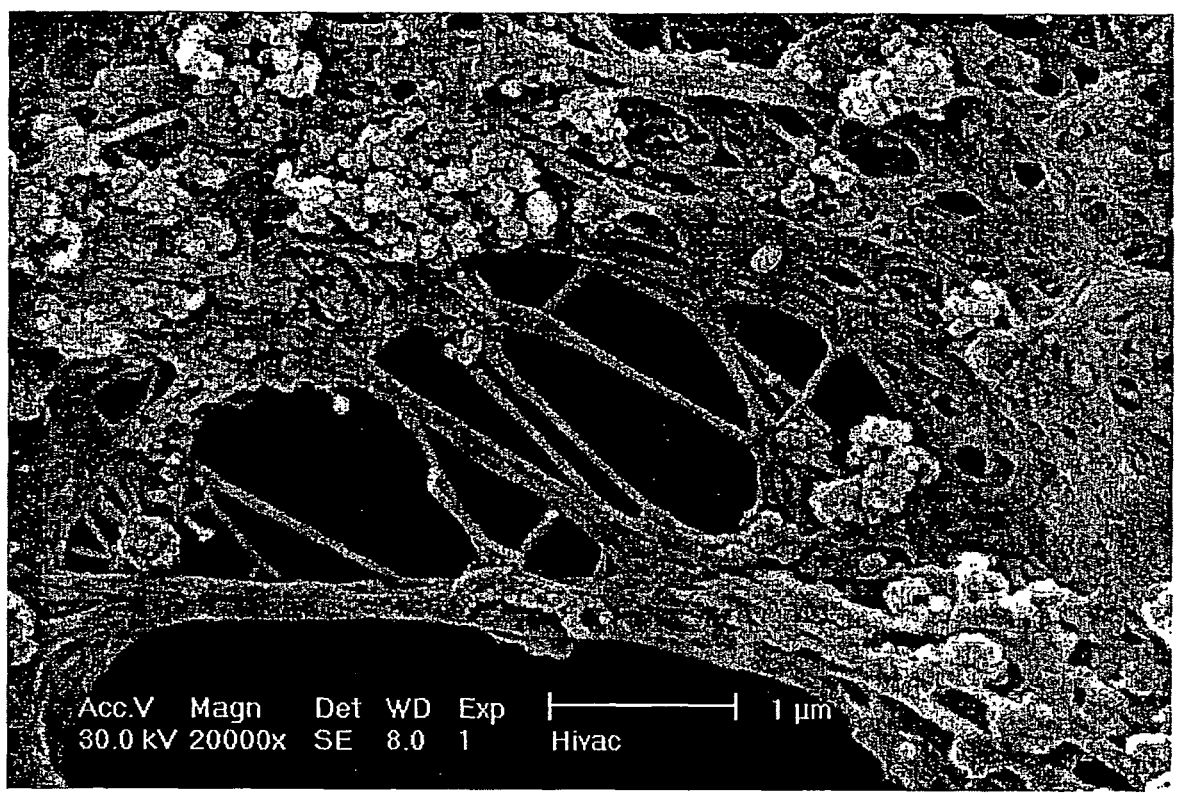
Figure 19: SEM image, at 20,000x, of the product of the reaction of SDS dispersed SWNTs with the LPD silica solution.

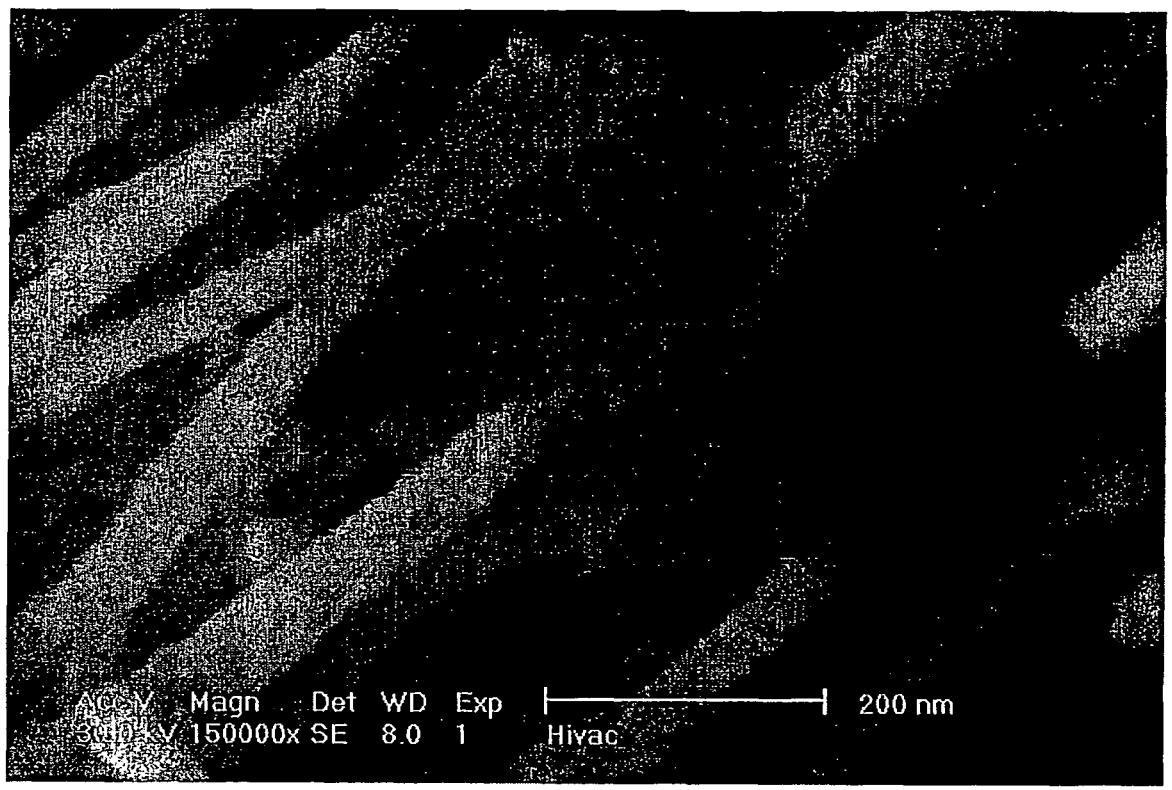
Figure 20: SEM image, at 150,000x, of the product of the reaction of SDS dispersed SWNTs with the LPD silica solution.

Figure 21: SEM image, at 25,000x, of the product of the reaction of SDS dispersed SWNTs with the LPD silica solution.

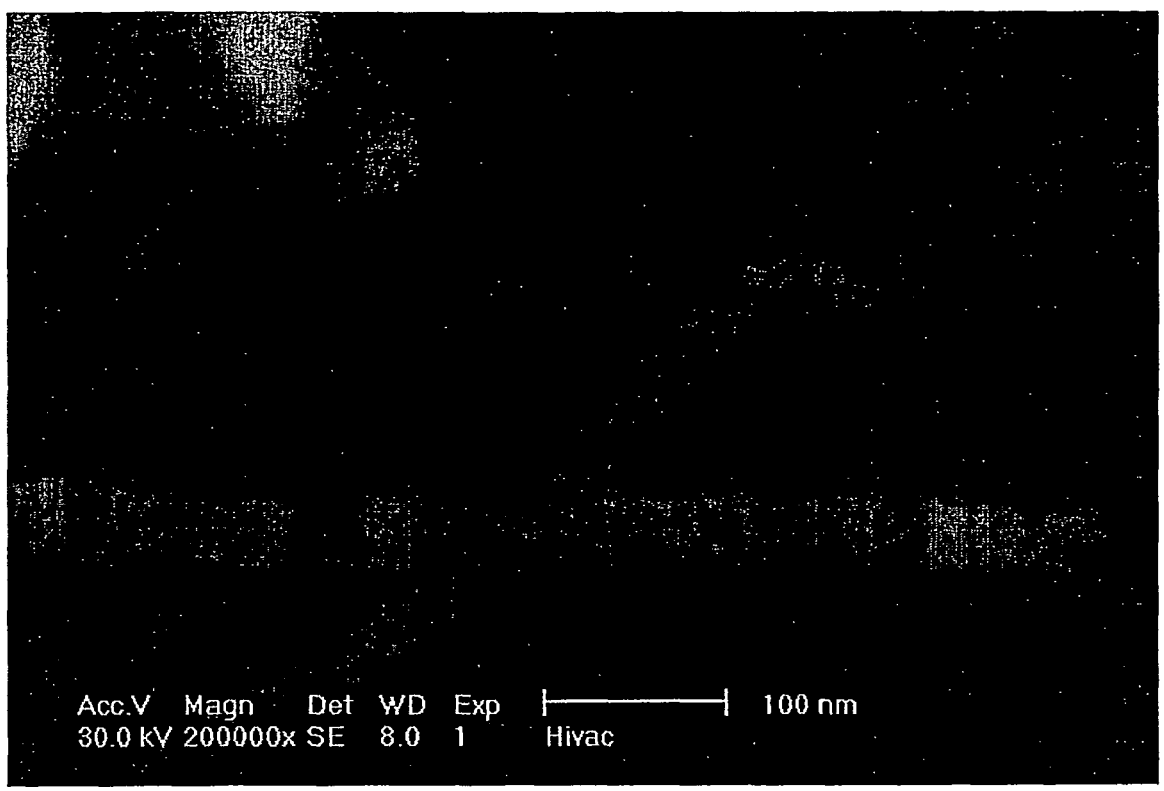
Figure 22: SEM image, at 200,000x, of the product of the reaction of SDS dispersed SWNTs with the LPD silica solution.

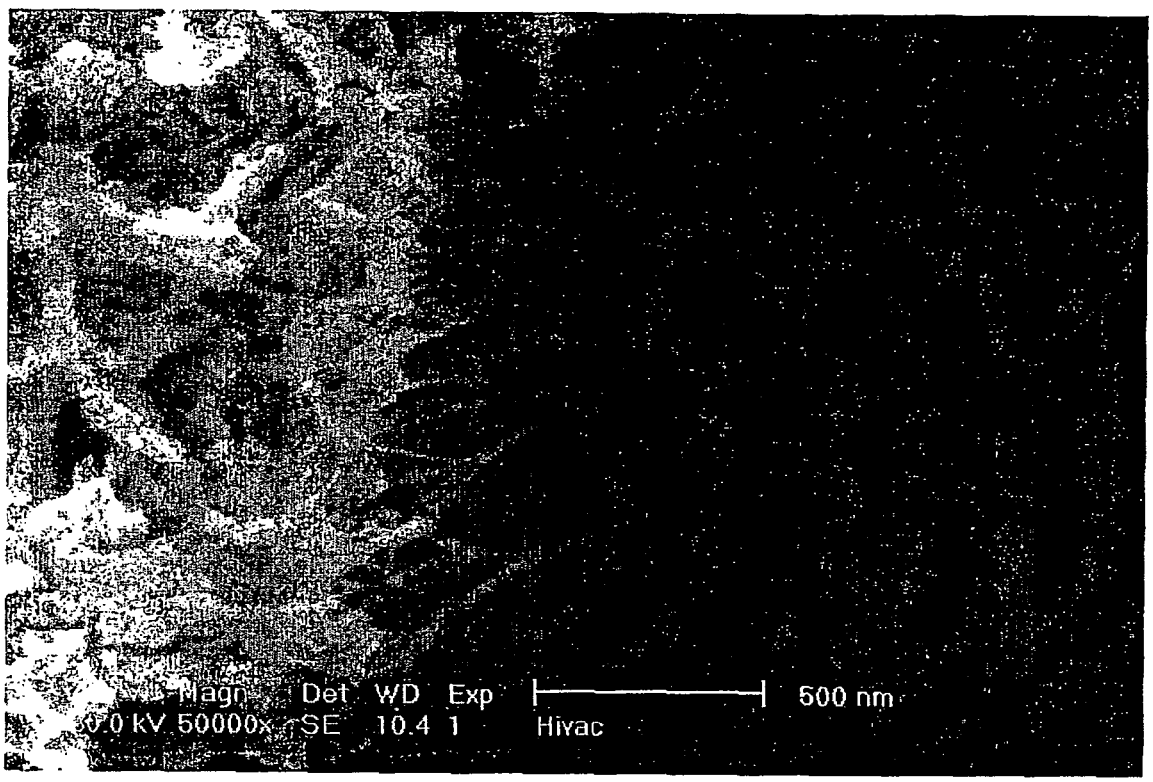
Figure 23: SEM image, at 50,000x, of a selectively etched silica coated SWNT.

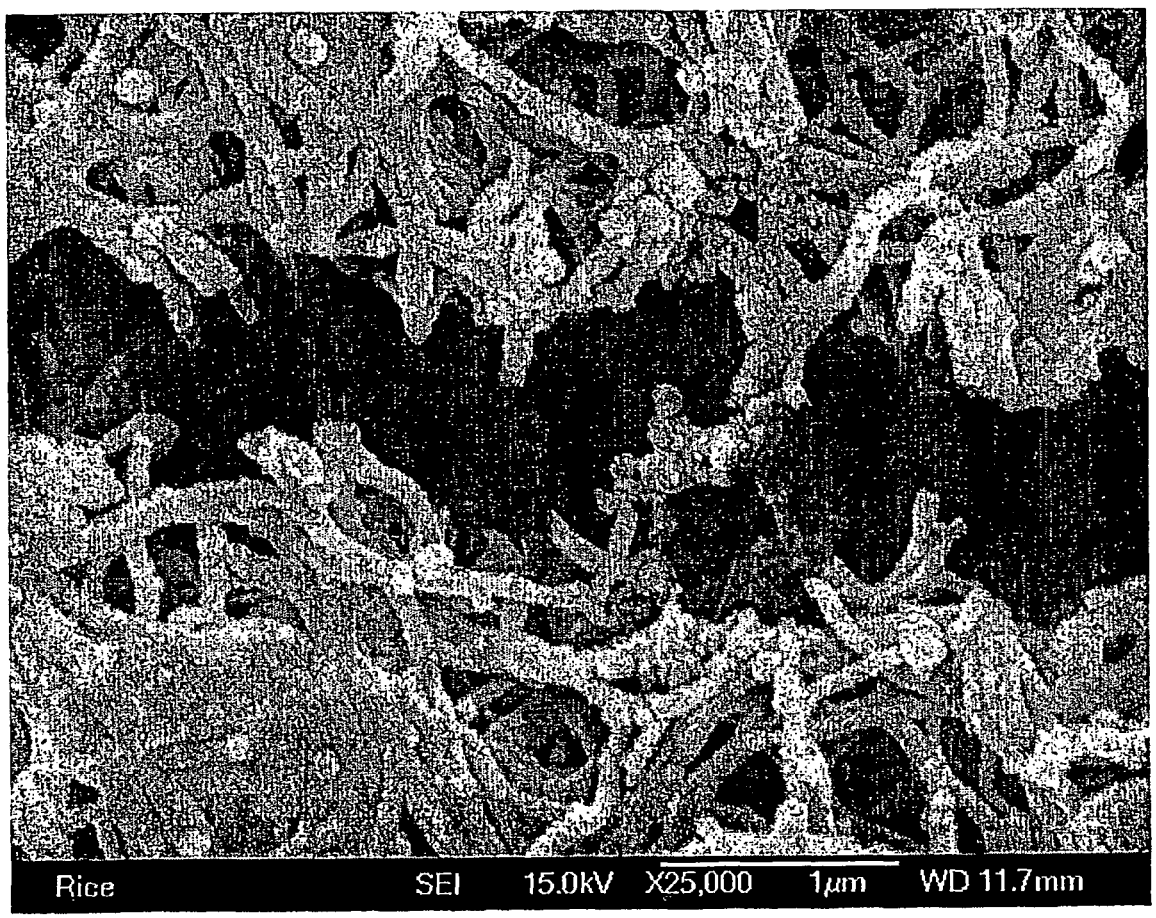
Figure 24: SEM image, at 25,000x, of a selectively etched silica coated SWNT.

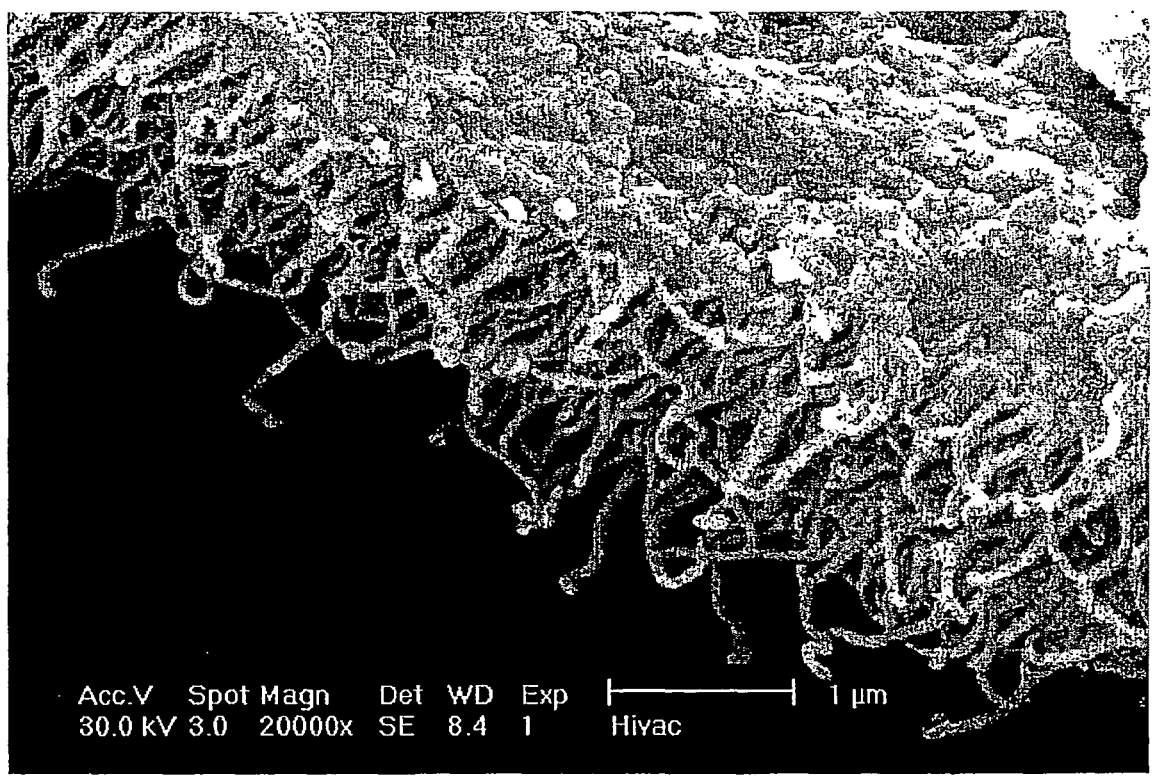
Figure 25: SEM image, at 20,000x, of the product of the reaction of DTAB dispersed SWNTs with the LPD silica solution.

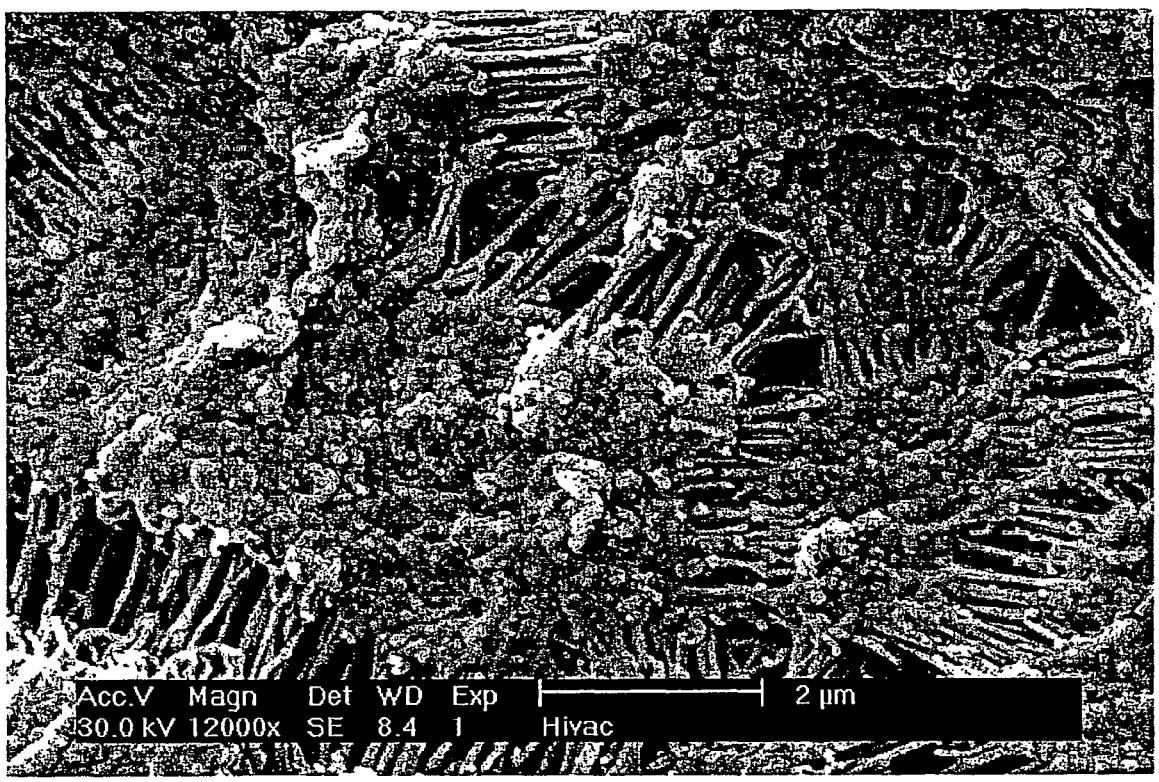
Figure 26: SEM image, at 12,000x, of the product of the reaction of DTAB dispersed SWNTs with the LPD silica solution.

Figure 27: TEM image, at 200,000x, of the product of the reaction of DTAB dispersed SWNTs with the LPD silica solution.

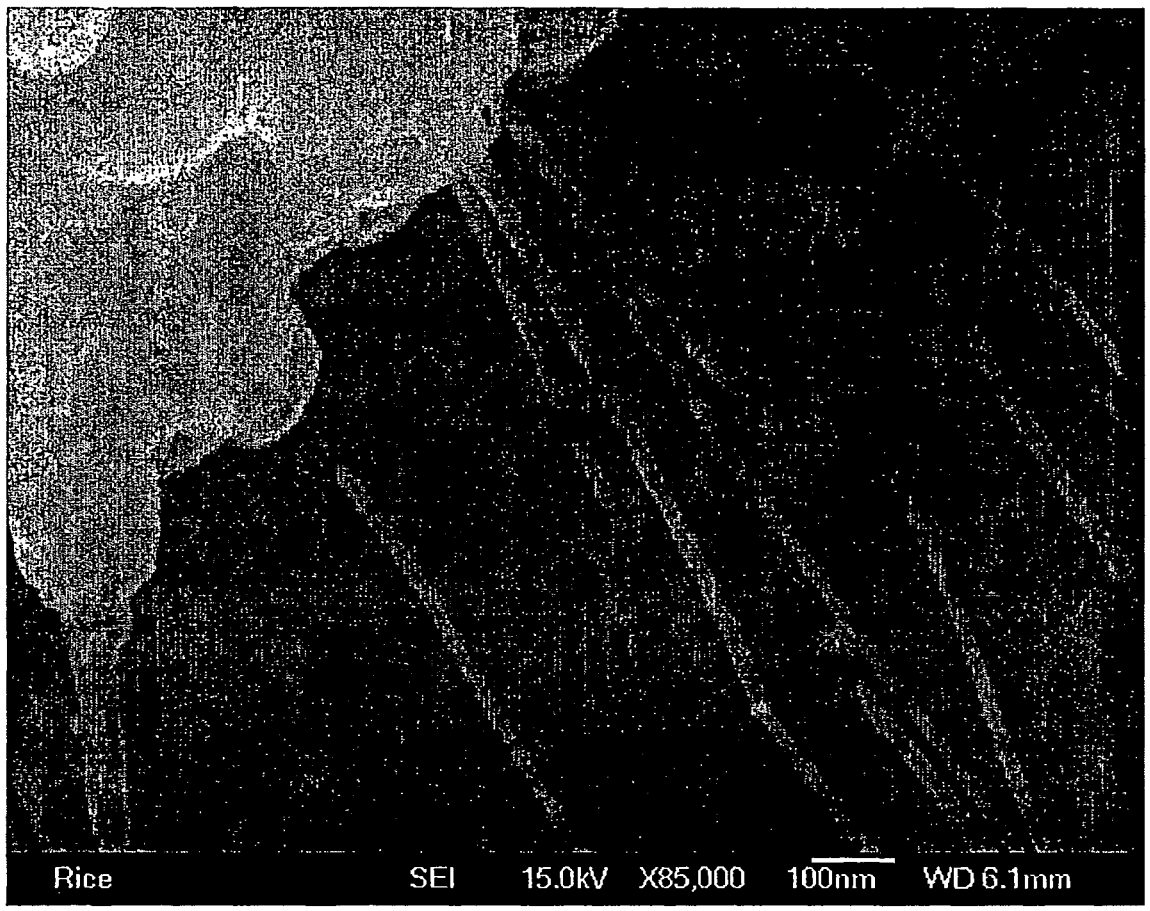
Figure 28: SEM image, at 65,000x, of the product of the reaction of DTAB dispersed SWNTs with the LPD silica solution.

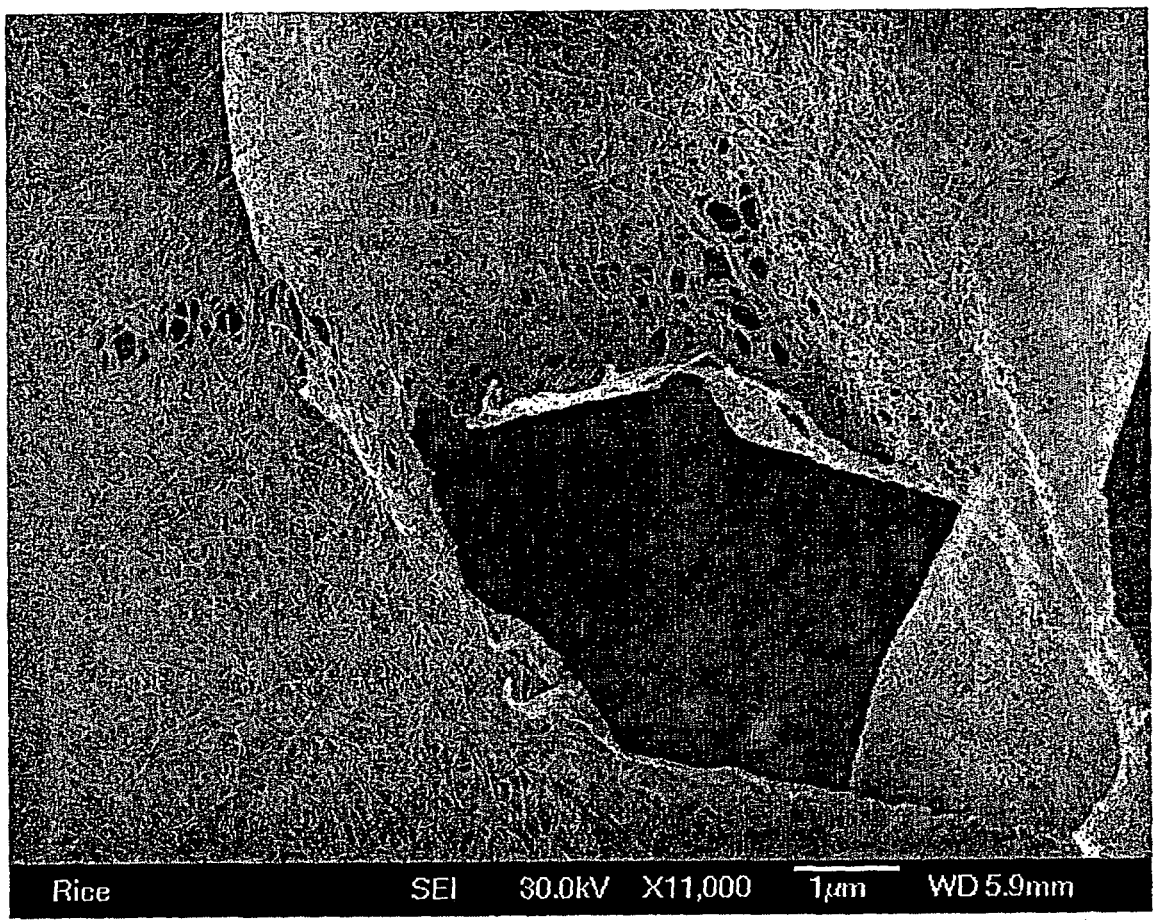
Figure 29: Thin silica-SWNT paper formed by light etching of coated nanotubes.

COATED FULLERENES, COMPOSITES AND DIELECTRICS MADE THEREFROM

STATEMENT REGARDING FEDERALLY SPONSORED RESEARCH OR DEVELOPMENT

Not applicable.

FIELD OF THE INVENTION

The present invention relates to coated fullerenes comprising a layer of at least one inorganic material covering at least a portion of at least one surface of a fullerene and methods for making. The present invention further relates to composites comprising the coated fullerenes of the present invention and further comprising polymers, ceramics and/or inorganic oxides. A coated fullerene interconnect device wherein at least two fullerenes are contacting each other to form a spontaneous interconnect is also disclosed as well as methods of making. In addition, dielectric films comprising the coated fullerenes of the present invention and methods of making are further disclosed.

BACKGROUND OF THE INVENTION

Fullerenes are broadly defined as the third form of the element carbon after diamond and graphite. Fullerenes are molecular solids that consist of fused six-membered and five-membered rings. Two general types of fullerenes may be described: Buckyballs and carbon nanotubes. Buckyballs have spherical structures and are typified by $C_{60}$. Other spherical fullerenes include $C_{70}$ and higher oligomers. Single walled carbon nanotubes (SWNTs) are elongated members of the fullerene family.

The interior cavity of a fullerene can accomodate an atom, molecule, or particle, depending on the volume circumscribed by the structure of the fullerene, to provide so-called doped fullerenes. Furthermore, fullerenes may be chemically functionalized by reacting the surface under suitable conditions to form either covalent, van der Waals or dipolar interactions with a chemical substituent.

SWNTs have come under intense multidisciplinary study because of their unique physical and chemical properties and their possible applications. The electronic characteristics of SWNT can be described as metallic or semiconducting; such characteristics deriving from the helicity and diameter of the SWNT. More importantly, it has been shown that these electronic properties are sensitive to the environment surrounding the SWNT. For example, it is well known that the presence of certain molecules, such as $O_2$ or $NH_3$, may alter the overall conductivity of SWNTs through the donation or acceptance of electrons. Such properties make SWNT ideal for nanoscale sensing materials. Nanotube field effect transistors (FETs), for example, have already been demonstrated as gas sensors. It is thought that selectivity in nanotube sensors can be achieved through the placement of specific functional groups on the nanotube surface; such groups having the requisite ability to selectively bind specific target molecules. Working against this goal is the fact that functionalization changes the electronic properties from that of a semiconductor or conductor to that of an insulator. Moreover, chemical functionalization of SWNT is not as of yet regiospecific. A further major obstacle to such efforts has been diversity of tube diameters, chiral angles, and aggregation states of the tubes. Aggregation is particularly problematic because highly polarizable, smooth sided SWNTs readily form bundles or ropes with van der Waals binding energy of ca. 500 eV per micrometer of tube contact. This bundling perturbs the electronic structure of the tubes and precludes the separation of SWNTs by size or type.

SWNT-based composites can provide excellent electronic and/or mechanical properties upon incorporation into a suitable matrix. Carbon nanotubes are excellent candidates for the fabrication of robust composites, and conducting polymers, due to their fascinating electronic and mechanical properties. Unfortunately, two issues must be overcome prior to development of large-scale applications. First, the SWNTs must be stable within a desired matrix. Second, the aggregation of SWNTs into ropes and bundles requires high loading that is uneconomic and represents a waste of materials.

The first of these issues requires that the SWNTs be protected from subsequent processing, e.g., oxidation. In addition, the formation of a stable tube/matrix interface is critical for composite applications. Surface treatments are required to ensure efficient tube-matrix interactions. Unfortunately, these treatments can result in the degradation of the tubes. The second of these issues requires that individual SWNTs (rather than bundles) be employed to maximize the impact of the SWNTs at the lowest possible loading.

It has been shown that individual SWNTs may be obtained encased in a cylindrical micelle, by ultrasonically agitating an aqueous dispersion of raw SWNTs in the presence of a suitable surfactant. See, O'Connell et al., Science 2002, vol. 297, pp. 593-596, incorporated herein by reference. Upon drying the micellular solution, however, bundles re-form. SWNTs have been encased in a wide range of organic materials. It would be desirable to fabricate individually coated SWNTs where the coating is retained in solution and the solid state. Of particular interest are dielectric materials such as silica, which may also be compatible with composite matrix materials. Silica is an example of an inorganic oxide.

Coating of $SiO_2$ on multiwalled carbon nanotubes (MWNTs) has been reported. See Seeger et al., Chem. Phys. Lett. 2001, vol. 339, pp. 41-46, incorporated herein by reference. However, these coatings required a sol-gel type of reaction and extremely long reaction times on the order of 150 hours. Coatings have also been reported on SWNTs, but these require isolation of the tubes on a surface prior to reaction. It would be advantageous if there was a method by which individual fullerenes and individual SWNT could be coated under near ambient temperatures with reaction times on the order of a few hours, without the need for isolation on a surface prior to coating.

The classical sol-gel process for generating thin films of an oxide, such as silica, on substrates can be divided into three steps: First, preparation of a stable dispersion of colloidal oxide particles in a liquid, "sol formation"; Second, aggregation of the particles to encompass the liquid, "gel formation", and deposition of the resulting gel on the surface of the substrate; and Third, removal of the solvent by drying and/or heating. See Vossen, et al., Adv. Mater. 2000, vol. 12, pp. 1434-1437, incorporated herein by reference.

In contrast, the liquid phase deposition, "LPD", of silica from saturated fluorosilicic acid solutions involves the reaction of water with silica precursors that are solvated at the molecular level to generate silica gels that deposit onto the surface of the substrate. See Yeh, et al., J. Electrochem. Soc. 1994, vol. 141, pp. 3177-3181, incorporated herein by reference. Whereas film growth in the sol-gel method is largely dependent on the size of the initial colloidal particles and its influence on their aggregation, growth in the LPD method is more controlled since it continues layer by layer as more molecules react on the surface of the substrate. The important step in LPD is to provide an active site for growth to occur on a surface.

The semiconductor industry has targeted the development of the interlayer and intrametal dielectric for the next several generations of higher density, faster computer chips, as specified by the milestones set out in the International Technology Roadmap for Semiconductors (the ITRS). There is still no acceptable material or process that produces films with the desired values of low dielectric constant (k value) concurrently with optimum electro- and thermo-mechanical properties. Current processes are based either on sol-gel methods for film deposition and growth, or on low temperature chemical vapor deposition (CVD) of carbon or fluorine-containing silicon dioxide films. The k values achieved by these processes are in the range from ~2.7 to greater than 3, still well above the maximum value of 2 required by the industry in order to meet the chip performance milestones identified in the ITRS.

Silicon dioxide ($SiO_2$) forms the basis of planar silicon chip technology. Insulator coatings for electronic and photonic devices layers are most frequently formed by thermal oxidation of silicon (Si) in the temperature range 900 to 1200° C. $SiO_2$ is also deposited by chemical vapor deposition (CVD) techniques at lower temperatures (200 to 900° C.) on various substrates. The growth of insulator films at low temperatures is very attractive for most device applications due to reduced capital cost, high output and freedom from technological constraints associated with the growth of dielectric thin films using conventional high-temperature growth/deposition techniques. Deposition of $SiO_2$ insulator layers from solution is previously known using organo-metallic solutions. In this procedure, the insulator layer is applied onto the substrate either by dipping the substrate into the solution or by spinning the substrate after a small amount of the solution is applied onto the surface. In both cases the substrate is then placed in an oven to drive off the solvent.

Attempts to produce porous silicon dioxide have failed to produce films with isolated voids and uniform void size, resulting in poor process reproducibility and film quality. Such processes also require the use of heat to evaporate a solvent or other component from the film to create the voids, something not required by the present invention.

CVD (chemical vapor deposition) requires the pyrolysis or photolysis of volatile compounds to create chemical fragments that are deposited on the surface of a substrate. The temperature of substrate is sufficiently high to allow mobility of fragments on the growth surface. These fragments travel around the surface until they find thermodynamically stable sites to which they attach. In this way the quality of CVD films is usually high. Thus, CVD uses surface growth. If gas phase growth occurs, uniform films are not produced. Instead, nanoparticles can form, from which films form after agglomeration. The resulting film requires further thermal processing in order to become uniform. Disadvantages with CVD include the high temperatures required and the use of volatile compounds or low pressures. Each of these adds to the environmental load of the process. Sol-gel is a low temperature method. Precursor compounds are dissolved in solution and reacted with additional reagents (usually water or an acid) to give a gel. If a film or coating is required, then the gel must be spin-coated onto the substrate. Since most sol-gels consist of nanoparticles or clusters with a significant organic content, additional thermal or chemical treatments are required to form a true inorganic material.

SUMMARY OF THE INVENTION

The present invention discloses, in one aspect, a method of making a coated fullerene comprising a layer of at least one inorganic material covering at least a portion of at least one surface of a fullerene wherein the method comprises (a) dispersing a fullerene under suitable conditions to provide a dispersed fullerene; and (b) depositing at least one inorganic material under suitable conditions onto at least one surface of the dispersed fullerene.

In another aspect, the present invention discloses a coated fullerene comprising a layer of at least one inorganic material covering at least a portion of at least one surface of a fullerene. The coated fullerene of the present invention is substantially similar to the coated fullerene described in connection with a previous aspect of this invention.

In yet another aspect of the present invention is disclosed a composite comprising a coated fullerene comprising a layer of at least one inorganic material covering at least a portion of at least one surface of a fullerene; and at least one composite matrix selected from the group consisting of polymers, ceramics and inorganic oxides.

In still another aspect is presented a method of making a coated fullerene interconnect device comprising a layer of at least one inorganic material covering at least a portion of at least one surface of fullerenes wherein at least two fullerenes are contacting each other to form a spontaneous interconnect; and at least one suitable metal contact is found at the site of at least one spontaneous interconnect wherein said method comprises (a) dispersing a fullerene under suitable conditions to provide a dispersed fullerene; (b) depositing at least one inorganic material under suitable conditions onto at least one surface of the dispersed fullerene to provide a coated fullerene; (c) isolating the coated fullerene; (d) removing at least a portion of the layer of inorganic material in a manner suitable for permitting at least two fullerenes to contact each other to provide at least one spontaneous interconnect; (e) optionally, separating at least one spontaneous interconnect; (f) optionally, allowing at least two fullerenes to contact each other to provide at least one new spontaneous interconnect; and (g) depositing a suitable metal contact at the site of at least one spontaneous interconnect and/or one new spontaneous interconnect.

In another aspect of the present invention is disclosed a coated fullerene interconnect device comprising a layer of at least one inorganic material covering at least a portion of at least one surface of fullerenes wherein at least two fullerenes are contacting each other to form a spontaneous interconnect; and at least one suitable metal contact is found at the site of at least one spontaneous interconnect.

In one more aspect, the present invention provides dielectric films comprising the coated fullerenes of the present invention. The dielectric films of the present invention are particularly well suited for use as interlayer or intermetal dielectric on silicon-based computer chips.

Possible applications for this invention include, but are not limited to, the following:

(1) Growth of insulating layers for nano-based chips. A new generation of nanotube or nanowire chips is being developed. At present these are 2D devices. However, in order for vertical integration to be developed a technology of low temperature insulator growth is require. A low k dielectric is not a requirement at present; oxide and silica films are therefore of potential interest for early generation devices.

(2) Growth of low k dielectric layers for advanced semiconductor chip fabrication. Insulating oxides (especially silica) are used as insulation layers in present chip technology. These are presently prepared by thermal oxidation, CVD, and sol gel techniques and have only limited success in achieving low k dielectric films. Additionally, a room temperature, or near room temperature, solution process would be cost effective.

BRIEF DESCRIPTION OF THE DRAWINGS

For a more detailed description of the preferred embodiments of the present invention, reference will be made to the accompanying drawings, wherein:

FIG. 1: Scanning electron microscope (SEM) image, at 15,000×, of silica product without particles added.

FIG. 2: SEM image, at 15,000×, of product of liquid phase deposition (LPD) silica reaction with fullerene added to reaction mixture.

FIG. 3: SEM image, at 15,000×, of product of LPD silica reaction with fullerenol added to reaction mixture.

FIG. 4: SEM image, at 50,000×, of product of LPD silica reaction with fullerenol added to reaction mixture.

FIG. 5: SEM image, at 50,000×, of product of LPD silica reaction with fullerenol added to reaction mixture.

FIG. 6: SEM image, at 5,000×, of product of LPD silica reaction with fullerenol added to reaction mixture.

FIG. 7: SEM image, at 100,000×, of product of LPD silica reaction with fullerenol added to reaction mixture.

FIG. 8: SEM image, at 6500×, of a silicon chip coated with silica-coated fullerenols.

FIG. 9: SEM image, at 35,000×, of a silicon chip coated with silica-coated fullerenols.

FIG. 10: SEM image, at 15,000×, of twice-coated silicon chip.

FIG. 11: SEM image, at 35,000×, of twice-coated silicon chip.

FIG. 12: SEM image, at 50×, of glass slide coated with silica coated fullerenols.

FIG. 13: SEM image, at 15,000×, of the product of the reaction of SDS with the LPD silica solution.

FIG. 14: SEM image, at 50,000×, of the product of the reaction of SDS with the LPD silica solution.

FIG. 15: SEM image, at 15,000×, of the product of the reaction of SDS dispersed single-walled carbon nanotubes (SWNTs) with the LPD silica solution.

FIG. 16: SEM image, at 120,000×, of the product of the reaction of SDS dispersed SWNTs with the LPD silica solution.

FIG. 17: SEM image, at 25,000×, of the product of the reaction of SDS dispersed SWNTs with the LPD silica solution.

FIG. 18: SEM image, at 120,000×, of the product of the reaction of SDS dispersed SWNTs with the LPD silica solution.

FIG. 19: SEM image, at 20,000×, of the product of the reaction of SDS dispersed SWNTs with the LPD silica solution.

FIG. 20: SEM image, at 150,000×, of the product of the reaction of SDS dispersed SWNTs with the LPD silica solution.

FIG. 21: SEM image, at 25,000×, of the product of the reaction of SDS dispersed SWNTs with the LPD silica solution.

FIG. 22: SEM image, at 200,000×, of the product of the reaction of SDS dispersed SWNTs with the LPD silica solution.

FIG. 23: SEM image, at 50,000×, of selectively etched silica coated SWNT.

FIG. 24: SEM image, at 25,000×, of selectively etched silica coated SWNT.

FIG. 25: SEM image, at 20,000×, of the product of the reaction of dodecyltrimethyl ammonium bromide (DTAB) dispersed SWNTs with the LPD silica solution.

FIG. 26: SEM image, at 12,000×, of the product of the reaction of DTAB dispersed SWNTs with the LPD silica solution.

FIG. 27: TEM image, at 200,000×, of the product of the reaction of DTAB dispersed SWNTs with the LPD silica solution.

FIG. 28: SEM image, at 65,000×, of the product of the reaction of DTAB dispersed SWNTs with the LPD silica solution.

FIG. 29: Thin silica-SWNT paper formed by light etching of coated nanotubes.

DETAILED DESCRIPTION OF THE INVENTION

This invention discloses the use of liquid phase deposition to prepare coated fullerenes. Such coated fullerenes may be spherical, such as $C_{60}$, or single walled nanotubes (SWNT). The present invention applies specifically to coating fullerenes with an inorganic material, such as, for example, an inorganic oxide typified by silica The present invention also discloses a method for growing films of inorganic oxides comprising fullerenes in a manner suitable for providing porous inorganic oxide films possessing desirable electronic and mechanical properties.

Method of Making a Coated Fullerene

The present invention discloses, in one aspect, a method of making a coated fullerene comprising a layer of at least one inorganic material covering at least a portion of at least one surface of a fullerene wherein the method comprises (a) dispersing a fullerene under suitable conditions to provide a dispersed fullerene; and (b) depositing at least one inorganic material under suitable conditions onto at least one surface of the dispersed fullerene.

As used herein, fullerene is any carbonaceous material wherein the structure is a regular, three dimensional network of fused carbon rings arranged in any one of a number of possible structures including, but not limited to, cylindrical, spherical, ovoid, oblate or oblong. Common fullerenes include the cylindrical carbon nanotube and the icosahedral $C_{60}$ carbon molecules. In particular, the fullerene is preferably selected from the group consisting of $C_{60}$, $C_{72}$, $C_{84}$, $C_{96}$, $C_{108}$, $C_{120}$, single-walled carbon nanotubes (SWNT) and multi-walled carbon nanotubes (MWNT). In one preferred embodiment of the process, the fullerene is $C_{60}$. In another preferred embodiment of the process, the fullerene is a single walled carbon nanotube (SWNT). Single-walled carbon nanotubes differ from multi-walled carbon nanotubes based on the number of concentric tubes present; single-walled carbon nanotubes comprise only one tube about a given center whereas multi-walled carbon nanotubes have at least two, and often more, nested tubes about a common center.

All carbon nanotubes tend to agglomerate into ropes and bundles of many carbon nanotubes and it is ordinarily quite difficult to obtain individual, dispersed carbon nanotubes. In one embodiment of the present process using single-walled carbon nanotubes (SWNT), either aggregated or individually dispersed tubes may be used. Special techniques are usually required to obtain individually dispersed carbon nanotubes and the methods used in the present invention will be discussed hereinbelow. In a particularly preferred embodiment of the present process, the fullerene is an individual single-walled carbon nanotube (SWNT).

The coated fullerene of the present method comprises a layer of at least one inorganic material. As defined here, an inorganic oxide will be any material comprising at least one inorganic element and oxygen; the oxide may additionally comprise other elements including, but not limited to, for example, hydrogen and fluorine. Although any one of a number of inorganic materials may be suitable for use in the present method, a preferred inorganic material is an inorganic oxide. In particular, although any one of a number of inorganic oxides could suffice in the present method, a preferred oxide is the oxide of silicon. The refractive index of the silica coatings used so far may be altered within a modest range.

The present method comprises dispersing a fullerene under suitable conditions to provide a dispersed fullerene. Though not wishing to be bound by any particular theory, it is believed that the process of dispersing a fullerene serves the dual purpose of allowing the fullerene to be soluble thereby permitting for the deposition of an inorganic material around individual tubes; and activating the tubes for deposition of an inorganic material. Suitable conditions for dispersing a fullerene comprise the use of a suitable solvent; water is a particularly preferred solvent. Suitable conditions may further comprise a particular technique to disperse fullerenes. Preferred techniques include chemical functionalization and surfactant addition.

Though not wishing to be bound by any particular theory, it is believed that chemical functionalization provides at least one, and possibly several, specific reactive site(s) that act as sites that initiate growth of the layer of inorganic material. In one embodiment, the fullerene is dispersed by a technique of chemical functionalization. As used herein, chemical functionalization is any chemical reaction that modifies and/or adds chemical groups to the surface of fullerene to leave a reactive group at a surface of a fullerene. Although there are many different chemical reactions that could be useful in the chemical functionalization of the present invention, it has been discovered that hydroxylation is a particularly useful chemical reaction for the chemical functionalization of the present invention.

The presence of surface hydroxylate groups on at least a portion of one surface of a fullerene tends to impart greater solubility to the fullerene in water, thereby discouraging aggregation. The hydroxylation allows for the fullerenes to be dispersed in aqueous solution thereby facilitating possible subsequent deposition.

In an alternate embodiment, the fullerene is dispersed by a technique of surfactant addition. Without wishing to be bound by any particular theory, it is believed that the surfactant surrounds the fullerenes and provides the required solubility while also assisting in dispersion of individual fullerenes. In one preferred embodiment, a single-walled carbon nanotube is dispersed by surfactant addition. According to this embodiment, the technique of surfactant addition may comprise the addition of sodium dodecylsulfate and/or dodecyltrimethyl ammonium bromide. The ability to uniformly coat individual SWNTs rather than ropes and bundles is a consequence of using a surfactant that is not affected by pH.

The present method still further comprises depositing at least one inorganic material under suitable conditions onto at least a portion of one surface of the dispersed fullerene. In one preferred embodiment, depositing at least one inorganic material under suitable conditions comprises contacting the dispersed fullerene with a solution comprising silica. According to this embodiment, the silica is preferably at least partially dissolved in the solution; and more preferably the solution further comprises $H_2SiF_6$. It is also important to employ a non sol-gel approach to allow seeded growth on the surface of the SWNT.

According to this embodiment, but without wishing to be bound by any particular theory, it is believed that fluorosilicic acid can react with base to produce silica, as shown in Equation (1).

$$H_2SiF_6 + 2OH^- \Leftrightarrow SiO_2 + 2F^- + 4HF \qquad (1)$$

Chemically functionalized substrates, such as hydroxylated $C_{60}$, can react with the acid in a condensation reaction, in turn acting as a nucleation site to begin layer growth as shown in Equation (2).

$$12H_2SiF_6 + C_{60}(OH)_{24}{}^{n-} \Leftrightarrow C_{60}(SiO_2)_{12} + 24F^- + 48HF \qquad (2)$$

Growth occurs at the initial silicate and reacts with additional fluorosilicic acid to grow layers of silica on the particle.

A key advantage of the present invention is that the rate of formation of deposition is significantly faster than that reported in the prior art. In addition, coating individual single-walled carbon nanotubes (SWNT) by a solution process has not been possible until now. According to the present method, depositing at least one inorganic material preferably takes place at a rate no less than 10 nm/hour.

The present method may further comprise isolating the coated fullerene. This is most preferably done using any technique of centriflgation. After the coating has reached the desired thickness, the coating reaction is quenched and the coated fullerenes may be isolated by centrifuge. The supernatant liquid is disposed of and the solid is re-dispersed in a suitable solvent such as ethanol. This centrifugation/re-ispersion process is repeated as required to purify the coated fullerenes. The coated SWNTs are then characterized in ethanol suspension or as a dried powder.

A Coated Fullerene

In another aspect, the present invention discloses a coated fullerene comprising a layer of at least one inorganic material covering at least a portion of at least one surface of a fullerene. The coated fullerene of the present invention is substantially similar to the coated fullerene described in connection with a previous aspect of this invention.

The coated fullerene comprises at least one inorganic material. Preferably, at least one inorganic material is an inorganic oxide; more preferably, an inorganic oxide is silica. The fullerene comprising the coated fullerene is preferably selected from the group consisting of $C_{60}$, $C_{72}$, $C_{84}$, $C_{96}$, $C_{108}$, $C_{120}$, single-walled carbon nanotubes (SWNT), and multi-walled carbon nanotubes (MWNT). The coated fullerene may comprise a fullerene doped with at least one type of metal. As used herein, a doped fullerene will be a fullerene comprising at least one metal wherein the atoms of metal may be within, adsorbed on, or incorporated into the fullerene. The coated fullerene may comprise a fullerene that is a single walled carbon nanotube (SWNT). The single walled carbon nanotubes (SWNT) may be present in the form of ropes, bundles, or individual tubes. In a preferred embodiment, the single-walled carbon nanotubes (SWNT) are present in the form of individual tubes. According to this embodiment, the coated fullerene further comprises at least one inorganic material. Preferably, this is an inorganic oxide; more preferably, silica Also according to this embodiment, the coated fullerenes may be handled as a solid without any substantial change in physical, electrical or mechanical properties. The coated fullerenes of the preferred embodiment will also show characteristic bands in the Raman spectrum indicative of individual tubes.

In addition, the coated fullerenes show no change in fluorescence intensity until the thickness of the coating is sufficient to cause scattering of the emitted light. This indicates that the coating does not alter the electrical properties and therefore the band gap of the fullerenes.

The prior art has shown that individual SWNTs strongly fluoresce in solution in the presence of a surfactant; in particular, excitation at 532 nm results in an emission between 950-1400 nm. This fluorescence is quenched under conditions that permit for the aggregation of SWNT into ropes and bundles, namely pH<5. The silica-coated single-walled carbon nanotubes of the present invention fluoresce in solution suggesting that individual single-walled carbon nanotubes rather than ropes have been successfully coated.

Composites

In yet another aspect of the present invention is disclosed a composite comprising a coated fullerene comprising a layer of at least one inorganic material covering at least a portion of at least one surface of a fullerene; and at least one composite matrix selected from the group consisting of polymers, ceramics and inorganic oxides.

The fullerenes used in the current aspect may be selected from the group consisting of $C_{60}$, $C_{72}$, $C_{84}$, $C_{96}$, $C_{108}$, $C_{120}$, single-walled carbon nanotubes (SWNT) and multi-walled carbon nanotubes. The fullerenes are more preferably $C_{60}$ or single-walled carbon nanotubes; but are most preferably single-walled carbon nanotubes (SWNT). In one preferred embodiment, at least a portion of at least one surface of a fullerene is chemically functionalized. In another preferred embodiment, at least one inorganic material is preferably an inorganic oxide; but most preferably, an inorganic oxide is silica.

Method of Making a Coated Fullerene Interconnect Device

The creation of device structures using fullerenes in an assembled array to create a specific device is of considerable interest. The creation of two- and three-dimensional structures comprising coated fullerenes and spontaneous interconnects led us to fabricate multi-function devices. Spontaneous interconnects will be defined as points of contact between at least two fullerenes. Gold connections may be deposited at the sites of these spontaneous interconnects to preferably provide devices comprising numerous connections between individual fullerenes.

In still another aspect is presented a method of making a coated fullerene interconnect device comprising a layer of at least one inorganic material covering at least a portion of at least one surface of fullerenes wherein at least two fullerenes are contacting each other to form a spontaneous interconnect; and at least one suitable metal contact is found at the site of at least one spontaneous interconnect wherein said method, comprises (a) dispersing a fullerene under suitable conditions to provide a dispersed fullerene; (b) depositing at least one inorganic material under suitable conditions onto at least one surface of the dispersed fullerene to provide a coated fullerene; (c) isolating the coated fullerene; (d) removing at least a portion of the layer of inorganic material in a manner suitable for permitting at least two fullerenes to contact each other to provide at least one spontaneous interconnect; (e) optionally, separating at least one spontaneous interconnect; (f) optionally, allowing at least two fullerenes to contact each other to provide at least one new spontaneous interconnect; and (g) depositing a suitable metal contact at the site of at least one spontaneous interconnect and/or one new spontaneous interconnect.

According to the present aspect, fullerenes are selected from the group consisting of $C_{60}$, $C_{72}$, $C_{84}$, $C_{96}$, $C_{108}$, $C_{120}$, single-walled nanotubes (SWNT) and multi-walled nanotubes (MWNT). Preferably, the fullerenes are single-walled carbon nanotubes (SWNT).

The present coated fullerene interconnect device comprises a layer of at least one inorganic material. Preferably, at least one inorganic material comprises an inorganic oxide; more preferably, an inorganic oxide is an oxide of silicon.

The present method of making a coated fullerene interconnect device comprises dispersing a fullerene under suitable conditions to provide a dispersed fullerene. Preferably, the fullerene is dispersed by a technique of chemical functionalization or surfactant addition.

The present method further comprises removing at least a portion of the layer of inorganic material; preferably this comprises treatment with a suitable etchant. In one embodiment, removing at least a portion of the layer of inorganic material is effective in removing all of the inorganic material. In another embodiment, at least a portion of the layer of inorganic material comprises selectively removing inorganic material from the ends of the fullerenes. In yet another embodiment, removing at least a portion of the layer of inorganic material in a suitable manner comprises selectively removing inorganic material from the central portion of the fullerenes.

The present method may further comprise allowing at least two fullerenes of at least one spontaneous contact to separate; this preferably comprises treatment with a suitable surfactant. The present method further comprises, optionally, allowing at least two fullerenes to contact each other to provide at least one new spontaneous interconnect.

According to a preferred embodiment, the number and nature of new spontaneous interconnects will differ from that observed for the first spontaneous interconnect. According to this embodiment, steps (e) and (f) may be repeated until a desired profile of electronic characteristics has been attained. Preferably, the characteristics may be those found in electronic switching and memory devices.

According to a preferred embodiment, the present method further comprises testing the coated fullerene interconnect devices for suitability as electronic devices.

A Coated Fullerene Interconnect Device

In another aspect of the present invention is disclosed a coated fullerene interconnect device comprising a layer of at least one inorganic material covering at least a portion of at least one surface of fullerenes wherein at least two fullerenes are contacting each other to form a spontaneous interconnect; and at least one suitable metal contact is found at the site of at least one spontaneous interconnect.

Preferably, the present coated fullerene interconnect device performs some electronic switching or memory function.

Dielectric Films Comprising Coated Fullerenes

One embodiment of the present invention is to dispense the previously coated fullerenes into the interlayer dielectric (ILD) or intermetal dielectric (IMD) layer growth process in such a manner as to achieve a specific void volume in the layer, while retaining the mechanical and electrical properties of the layer required for successful chip fabrication and performance. This invention provides a way to combine the above approaches to give a low temperature solution process that allows for the formation of uniform films; the films can be prepared with a variety of properties optimized for specific applications.

The second is to grow multiple layers of the porous oxide films on large area wafers at the appropriate process steps in chip fabrication. The first layer of porous silicon dioxide with fullerene inclusions must be grown directly on the silicon wafer after it has been patterned with nano-scale transistors, and may use a different solution from that used to coat the fullerenes. All subsequent porous films must be grown on composite surfaces consisting of sub-micron width copper lines embedded in previously grown porous $SiO_2$ films, and may use yet another solution compared to those mentioned above.

Prior art attempts to produce porous silicon dioxide have failed to produce films with isolated voids and uniform void size, resulting in poor process reproducibility and film quality. Such processes also require the use of heat to evaporate a solvent or other component from the film to create the voids, something not required by the present invention. The present process will produce distinct voids of controllable size in a film with superior properties compared to the CVD and sol gel processes with which it competes.

EXAMPLES

The following examples are presented to illustrate the ease and versatility of the approach and are not to be construed as the only examples of the proposed approach or as limiting the scope of the present invention. It is understood that a practitioner, of ordinary skill in the art, will be able to employ alternative reagents and coatings to achieve similar results.

Example 1

Fumed silica (3.0 g) was added to 50 mL of 3.20 M fluorosilicic acid solution ($H_2SiF_6$: Riedel de Haen, 34% pure) and allowed to stir overnight. This solution was then filtered, by vacuum, through a 0.22 micron Millipore filter. The solution was then diluted to 1.0 M with Millipore (UP) water. A sample of this solution (10 mL) was allowed to react in a plastic centrifuge tube. This mixture was stirred, at 30° C., for 3 hours. The product was then filtered, washed with UP water, dried and analyzed as a powder. The product was imaged with a scanning electron microscope (SEM); the resulting micrograph is shown in FIG. 1.

Example 2

Fumed silica (3.0 g) was added to 50 mL of 3.20 M fluorosilicic acid solution ($H_2SiF_6$: Riedel de Haen, 34% pure) and allowed to stir overnight. This solution was then filtered, by vacuum, through a 0.22 micron Millipore filter. The solution was then diluted to 1.0 M with UP water. A sample of this solution (10 mL) was allowed to react with fullerene (10 mg) in a plastic centrifuge tube. This mixture was stirred, at 30° C., for 3 hours. The product was then filtered, washed with UP water, dried and analyzed as a powder. The liquid phase deposition (LPD) product was imaged with a scanning electron microscope (SEM); the resulting micrograph is shown in FIG. 2.

Example 3

Fumed silica (3.0 g) was added to 50 mL of 3.20 M fluorosilicic acid solution ($H_2SiF_6$: Riedel de Haen, 34% pure) and allowed to stir overnight. This solution was then filtered, by vacuum, through a 0.22 micron Millipore filter. The solution was then diluted to 1.0 M with UP water. A sample of this solution (10 mL) was allowed to react with fullerenol (10 mg) in a plastic centrifuge tube. This mixture was stirred, at 30° C., for 12 hours. The product was then filtered, washed with UP water, dried and analyzed as a powder. The product was imaged with a scanning electron microscope (SEM); the resulting micrographs are shown in FIGS. 3 and 4.

Example 4

Fumed silica (3.0 g) was added to 50 mL of 3.20 M fluorosilicic acid solution ($H_2SiF_6$: Riedel de Haen, 34% pure) and allowed to stir overnight. This solution was then filtered, by vacuum, through a 0.22 micron Millipore filter. The solution was then diluted to 1.0 M with UP water. A sample of this solution (5 mL) was allowed to react with fullerenol (5 mL of a 50 mg/L solution) in a plastic centrifuge tube. This mixture was stirred, at 30° C., for 12 hours. The product was then centrifuged at 4000 rpm for 60 minutes. The supernatant liquid was discarded. The product was then redispersed in ethanol by sonification. This process was repeated six times. The product was then dried and analyzed as a powder. The product was imaged with a scanning electron microscope (SEM); the resulting micrograph is shown in FIG. 5.

Example 5

Fumed silica (3.0 g) was added to 50 mL of 3.20 M fluorosilicic acid solution ($H_2SiF_6$: Riedel de Haen, 34% pure) and allowed to stir overnight. This solution was then filtered, by vacuum, through a 0.22 micron Millipore filter. The solution was then diluted to 1.0 M with UP water. A sample of this solution (20 mL) was allowed to react with fullerenol (10 mg) in a plastic centrifuge tube. This mixture was stirred, at 30° C., for 3 hours. The product was then centrifuged at 4000 rpm for 60 minutes. The supernatant liquid was discarded. The product was then redispersed in ethanol by sonification. This process was repeated six times. The product was then dried and analyzed as a powder. The product was imaged with a scanning electron microscope (SEM); the resulting micrographs are shown in FIGS. 6 and 7.

Example 6

Fumed silica (3.0 g) was added to 50 mL of 3.20 M fluorosilicic acid solution ($H_2SiF_6$: Riedel de Haen, 34% pure) and allowed to stir overnight. This solution was then filtered, by vacuum, through a 0.22 micron Millipore filter. The solution was diluted to 1.00 M. Fullerenols (10 mg) were added to a sample of this solution (50 mL) and allowed to react in a Tupperware container. To this mixture was added a silicon chip which had been etched first in RCA-1 etch ($NH_4OH$:$H_2O_2$:$H_2O$), followed by a Millipore water rinse and then etched with an RCA-2 etch (HCl:$H_2O_2$:$H_2O$) and again rinsed. The solution with the chip was stirred, at 30° C., for 4 hours. The chip was then removed from the solution, rinsed in Millipore water and dried with compressed air. The product was imaged with a scanning electron microscope (SEM); the resulting micrographs are shown in FIGS. 8 and 9.

Example 7

Fumed silica (3.0 g) was added to 50 mL of 3.20 M fluorosilicic acid solution ($H_2SiF_6$: Riedel de Haen, 34% pure) and allowed to stir overnight. This solution was then filtered, by vacuum, through a 0.22 micron Millipore filter. The solution was diluted to 1.00 M. Fullerenols (10 mg) were added to a sample of this solution (50 mL) and allowed to react in a Tupperware container. To this mixture was added a silicon chip which had been previously coated with silica-coated fullerenols. The solution with the chip was stirred, at 30° C., for 4 hours. The chip was then removed from the solution, rinsed in Millipore water and dried with compressed air. The product was imaged with a scanning electron microscope (SEM); the resulting micrographs are shown in FIGS. 10 and 11.

Example 8

Fumed silica (3.0 g) was added to 50 mL of 3.20 M fluorosilicic acid solution ($H_2SiF_6$: Riedel de Haen, 34% pure) and allowed to stir overnight. This solution was then filtered, by vacuum, through a 0.22 micron Millipore filter. The solution was then diluted to 1.0 M with UP water. A sample of this solution (50 mL) was allowed to react with fullerenol (10 mg) in a plastic centrifuge tube. This mixture was stirred, at 30° C., for 3 hours. The product was then centrifuged at 4000 rpm for 60 minutes. The supernatant liquid was discarded. The product was then redispersed in ethanol by sonification. This process was repeated six times. The product, dispersed in ethanol, was transferred to a clean scintillation vial. A glass slide, which had been cleaned in a base bath, copiously rinsed in UP water and stored in ethanol, was placed upright in the scintillation vial. The solution was then allowed to evaporate overnight. The coated fullerenols coated the glass slide via capillary action. The product was imaged with a scanning electron microscope (SEM); the resulting micrograph is shown in FIG. 12.

Example 9

Fumed silica (3.0 g) was added to 50 mL of 3.20 M fluorosilicic acid solution ($H_2SiF_6$: Riedel de Haen, 34% pure) and allowed to stir overnight. This solution was then filtered, by vacuum, through a 0.22 micron Millipore filter. The solution was then diluted to 1.0 M with UP water. A sample of this solution (100 mL) was allowed to react with sodium dodecylsulfate (SDS, 1 mL of a 1% solution) in a plastic centrifuge tube. This mixture was stirred, at 30° C., for 3 hours. The product was then centrifuged at 4000 rpm for 60 minutes. The supernatant liquid was discarded. The product was then redispersed in ethanol by sonification. This process was repeated six times. The product was then dried and analyzed as a powder. The product was imaged with a scanning electron microscope (SEM); the resulting micrographs are shown in FIGS. 13 and 14.

Example 10

Fumed silica (3.0 g) was added to 50 mL of 3.20 M fluorosilicic acid solution ($H_2SiF_6$: Riedel de Haen, 34% pure) and allowed to stir overnight. This solution was then filtered, by vacuum, through a 0.22 micron Millipore filter. The filtrate was diluted to 1.0 M with UP water. A portion of this solution (100 mL) was added to a 1% SDS solution (1 mL) containing dispersed single walled carbon nanotubes (SWNT, 50 mg/L). These were allowed to react in a plastic centrifuge tube, with stirring, at 30° C., for four hours. The reaction was then quenched with ethanol and centrifuged at 4400 rpm for 15 minutes. The supernatant liquid was disposed of and the solid was redispersed in ethanol. This process was repeated six times. The coated single-walled carbon nanotubes (SWNTs) were then characterized in ethanol solution or as a dried powder. The product was imaged with a scanning electron microscope (SEM); the resulting micrographs are shown in FIGS. 15 and 16.

Example 11

Fumed silica (3.0 g) was added to 50 mL of 3.20 M fluorosilicic acid solution ($H_2SiF_6$: Riedel de Haen, 34% pure) and allowed to stir overnight. This solution was then filtered, by vacuum, through a 0.22 micron Millipore filter. The filtrate was diluted to 1.0 M with UP water. A portion of this solution (5 mL) was added to a 1% SDS solution (5 mL) containing dispersed SWNT (50 mg/L). These were allowed to react in a plastic centrifuge tube, with stirring, at 30° C., for four hours. The reaction was then quenched with ethanol and centrifuged at 4400 rpm for 15 minutes. The supernatant liquid was disposed of and the solid was redispersed in ethanol. This process was repeated six times. The coated SWNTs were then characterized in ethanol solution or as a dried powder. The product was imaged with a scanning electron microscope (SEM); the resulting micrographs are shown in FIGS. 17 and 18.

Example 12

Fumed silica (3.0 g) was added to 50 mL of 3.20 M fluorosilicic acid solution ($H_2SiF_6$: Riedel de Haen, 34% pure) and allowed to stir overnight. This solution was then filtered, by vacuum, through a 0.22 micron Millipore filter. The filtrate was diluted to 1.0 M with UP water. A portion of this solution (3 mL) was added to a 1% sodium dodecyl sulfate (SDS) solution (6.25 mL) containing dispersed SWNT (40 mg/L). These were allowed to react in a plastic centrifuge tube, with stirring, at 30° C., for four hours. The reaction was then quenched with ethanol and centrifuged at 4400 rpm for 15 minutes. The supernatant liquid was disposed of and the solid was redispersed in ethanol. This process was repeated six times. The coated SWNTs were then characterized in ethanol solution or as a dried powder. The product was imaged with a scanning electron microscope (SEM); the resulting micrographs are shown in FIGS. 19 and 20.

Example 13

Fumed silica (3.0 g) was added to 50 mL of 3.20 M fluorosilicic acid solution ($H_2SiF_6$: Riedel de Haen, 34% pure) and allowed to stir overnight. This solution was then filtered, by vacuum, through a 0.22 micron Millipore filter. The filtrate was diluted to 1.0 M with UP water. A portion of this solution (1 mL) was added to a 1% SDS solution (6.25 mL) containing dispersed SWNT (40 mg/L). These were allowed to react in a plastic centrifuge tube, with stirring, at 30° C., for four hours. The reaction was then quenched with ethanol and centrifuged at 4400 rpm for 15 minutes. The supernatant liquid was disposed of and the solid was redispersed in ethanol. This process was repeated six times. The coated SWNTs were then characterized in ethanol solution or as a dried powder. The product was imaged with a scanning electron microscope (SEM); the resulting micrographs are shown in FIGS. 21 and 22.

Example 14

Products from Examples 12 and 13 were dried on a surface and selectively etched with hydrofluoric acid (1%). They were then thoroughly rinsed with UP water and dried for characterization. The product was imaged with a scanning electron microscope (SEM); the resulting micrographs are shown in FIGS. 23 and 24.

Example 15

Fumed silica (3.0 g) was added to 50 mL of 3.20 M fluorosilicic acid solution ($H_2SiF_6$: Riedel de Haen, 34% pure) and allowed to stir overnight. This solution was then filtered, by vacuum, through a 0.22 micron Millipore filter. The filtrate was diluted to 1.0 M with UP water. A portion of this solution (1 mL) was added to a 1% dodecyltrimethyl ammonium bromide solution (DTAB, 5 mL) containing dispersed SWNT (30 mg/L). These were allowed to react in a plastic centrifuge tube, with stirring, at 30° C., for twelve hours. The reaction was then quenched with ethanol and centrifuged at 4400 rpm for 15 minutes. The supernatant liquid was disposed of and the solid was redispersed in ethanol. This process was repeated six times. The coated SWNTs were then characterized in ethanol solution or as a dried powder. The product was imaged with a scanning electron microscope (SEM); the resulting micrographs are shown in FIGS. 25 and 26.

Example 16

Fumed silica (3.0 g) was added to 50 mL of 3.20 M fluorosilicic acid solution ($H_2SiF_6$: Riedel de Haen, 34% pure) and allowed to stir overnight. This solution was then filtered, by vacuum, through a 0.22 micron Millipore filter. The filtrate was diluted to 1.0 M with UP water. A portion of this solution (1 mL) was added to a 1% DTAB solution (8.33 mL) containing dispersed SWNT (30 mg/L). These were allowed to react in a plastic centrifuge tube, with stirring, at 30° C., for fifteen minutes. The reaction was then quenched with ethanol and centrifliged at 4400 rpm for 15 minutes. The supernatant liquid was disposed of and the solid was dispersed in ethanol. This process was repeated six times. The coated SWNTs were then characterized in ethanol solution or as a dried powder. The product was imaged with a scanning electron microscope (SEM); the resulting micrographs are shown in FIGS. 27 and 28.

Example 17

A sample of the product from example 16 was dried on a surface and then quickly etched with hydrofluoric acid. After a defined time period, the etch was quenched in UP water. The etched material was then allowed to dry on a metal stub. A thin coated SWNT paper was formed. The product was imaged with a scanning electron microscope (SEM); the resulting micrograph is shown in FIG. 29.

Example 18

A sample of the product of example 16, dispersed in ethanol was added to powdered PVP, with stirring. Once the solvent had evaporated, a sample of polymer with well-dispersed coated nanotubes was obtained.

What is claimed is:

1. A method for making a coated fullerene, said method comprising:
    (a) dispersing a fullerene in a solvent to provide a solution comprising a dispersed fullerene that is soluble in the solvent; and
    (b) depositing a layer of at least one inorganic oxide from the solution onto at least a portion of at least one surface of the dispersed fullerene at a rate equal to or greater than 10 nm/hour,
    wherein depositing comprises utilizing a liquid phase deposition technique that is not a sol-gel process.

2. The method according to claim 1, wherein the fullerene is selected from the group consisting of $C_{60}$, $C_{72}$, $C_{84}$, $C_{96}$, $C_{108}$, $C_{120}$, single-walled carbon nanotubes (SWNT) and multi-walled nanotubes (MWNT).

3. The method according to claim 2, wherein the fullerene is $C_{60}$.

4. The method according to claim 2, wherein the fullerene is single walled carbon nanotubes (SWNT).

5. The method according to claim 4, wherein the single walled carbon nanotubes (SWNT) are present in the form of an aggregate or individual tubes.

6. The method according to claim 5, wherein the aggregate is a rope or bundle.

7. The method according to claim 5, wherein the fullerene is an individual SWNT.

8. The method according to claim 1, wherein the inorganic oxide is an oxide of silicon.

9. The method according to claim 1, wherein the solvent is water.

10. The method according to claim 1, wherein the fullerene is dispersed by a technique of chemical functionalization or surfactant addition.

11. The method according to claim 10, wherein the fullerene is dispersed by a technique of chemical functionalization.

12. The method according to claim 11, wherein the technique of chemical functionalization comprises hydroxylation of the surface of the fullerene.

13. The method according to claim 10, wherein the fullerene is dispersed by a technique of surfactant addition.

14. The method according to claim 13, wherein the fullerene is single-walled carbon nanotubes (SWNT).

15. The method according to claim 14, wherein the technique of surfactant addition comprises the addition of sodium dodecylsulfate (SDS) to the solvent.

16. The method according to claim 14, wherein the technique of surfactant addition comprises the addition of dodecyltrimethyl ammonium bromide to the solvent.

17. The method according to claim 1, wherein the solution further comprises silica.

18. The method according to claim 17, wherein the silica is at least partially dissolved in the solution.

19. The method according to claim 17, wherein the solution further comprises $H_2SiF_6$.

20. The method according to claim 1, further comprising: isolating the coated fullerene.

21. The method according to claim 20, wherein isolating the coated fullerene comprises using any technique of centrifugation.

22. The method according to claim 20, further comprising: redispersing the coated fullerene in a solvent to produce a redispersed coated fullerene.

23. The method according to claim 22, further comprising: isolating the redispersed coated fullerene.

24. The method according to claim 1, wherein the inorganic oxide is an insulating material.

25. The method according to claim 1, further comprising: isolating the coated fullerene at equal to or less than 12 hours after depositing the at least one inorganic oxide.

26. The method according to claim 1, wherein depositing the layer of at least one inorganic oxide comprises growing the at least one inorganic oxide on the at least one surface of the dispersed fullerene;
    wherein growth of the at least one inorganic oxide initiates at a plurality of nucleation sites on the surface of the dispersed fullerene.

27. The method according to claim 1, wherein depositing the layer of at least one inorganic oxide comprises contacting the dispersed fullerenes with a solution comprising the inorganic oxide to initiate growth thereof.

28. A method for making a coated fullerene, said method comprising:
    activating at least a surface portion of a fullerene to form an activated region on the fullerene; and
    growing an inorganic oxide on the activated region so as to at least partially coat the fullerene with the inorganic oxide;
        wherein growing the inorganic oxide takes place at a rate equal to or greater than 10 nm/hour by a process comprising a liquid phase deposition technique that is not a sol-gel process.

29. The method according to claim 28, wherein the activated region comprises one or more nucleation sites for growth of the inorganic oxide.

30. The method according to claim 29, wherein the one or more nucleation sites are formed by hydroxylating at least a surface portion of the fullerene.

31. The method according to claim 29, wherein growing the inorganic oxide on the activated region comprises growing one or more layers of the inorganic oxide on the surface of the dispersed fullerene;
    wherein growth of the one or more layers of the inorganic oxide initiates at the one or more nucleation sites on the surface of the dispersed fullerene.

32. The method according to claim 31, wherein growing one or more layers of inorganic oxide takes place by a condensation reaction.

33. The method according to claim 28, wherein the fullerene is an individual carbon nanotube.

34. The method according to claim 28, wherein the inorganic oxide comprises silica.

35. A method for coating a fullerene with an inorganic oxide, said method comprising:
    dispersing a fullerene in a solvent;
    chemically functionalizing at least a surface portion of the fullerene to form a functionalized surface portion on the fullerene; and
    growing an inorganic oxide on the functionalized surface portion at a rate of equal to or greater than 10 nm/hour by a process comprising a liquid phase deposition technique that is not a sol-gel process.

36. The method according to claim 35, wherein chemically functionalizing at least a surface portion of the fullerene comprises reacting the surface portion of the fullerene with one or more reagents to generate at least one nucleation site for growth of the inorganic oxide.

37. The method according to claim 36, wherein reacting the surface portion of the fullerene to generate at least one nucleation site comprises hydroxylating at least a surface portion of the fullerene.

38. The method according to claim 35, further comprising: adding a surfactant to the solvent to disperse the fullerene therein.

39. The method according to claim 38, wherein the surfactant is selected from the group consisting of sodium dodecylsulfate (SDS) and dodecyltrimethyl ammonium bromide.

40. The method according to claim 35, wherein growing the inorganic oxide comprises contacting the fullerene with a solution comprising silica.

41. The method according to claim 35, wherein growing is quenched when a desired thickness of the inorganic oxide is achieved.

42. The method according to claim 35, wherein the fullerene is an individual carbon nanotube.

43. The method according to claim 35, wherein the fullerene exhibits characteristic bands in the Raman spectra indicative of individual tubes.

* * * * *